(12) United States Patent
Huang et al.

(10) Patent No.: US 11,536,760 B2
(45) Date of Patent: Dec. 27, 2022

(54) TESTING DEVICE, TESTING SYSTEM, AND TESTING METHOD

(71) Applicant: Advanced Semiconductor Engineering, Inc., Kaohsiung (TW)

(72) Inventors: Hung-Jen Huang, Kaohsiung (TW); Yen-Chun Wang, Kaohsiung (TW); Chen-Kuo Chu, Kaohsiung (TW); I-Chun Liu, Kaohsiung (TW)

(73) Assignee: ASE TEST, INC., Kaohsiung (TW)

( * ) Notice: Subject to any disclaimer, the term of this patent is extended or adjusted under 35 U.S.C. 154(b) by 757 days.

(21) Appl. No.: 15/944,672

(22) Filed: Apr. 3, 2018

(65) Prior Publication Data

US 2019/0162774 A1 May 30, 2019

Related U.S. Application Data

(60) Provisional application No. 62/591,674, filed on Nov. 28, 2017.

(51) Int. Cl.
| | | |
|---|---|---|
| *G01R 29/10* | (2006.01) | |
| *G01R 31/00* | (2006.01) | |
| *G01R 1/04* | (2006.01) | |
| *G01R 31/28* | (2006.01) | |
| *G01R 31/302* | (2006.01) | |

(52) U.S. Cl.
CPC ............ *G01R 29/105* (2013.01); *G01R 1/045* (2013.01); *G01R 31/002* (2013.01); *G01R 31/2822* (2013.01); *G01R 31/3025* (2013.01)

(58) Field of Classification Search
CPC .... G01R 1/045; G01R 3/002; G01R 31/2822; G01R 31/2824; G01R 31/2889; G01R 31/3025; G01R 31/303; G01R 29/0821; G01R 29/0828; G01R 29/105; H04B 17/16
USPC ............... 324/756.02, 756.01, 537, 500
See application file for complete search history.

(56) References Cited

U.S. PATENT DOCUMENTS

| | | | |
|---|---|---|---|
| 7,915,909 | B2 | 3/2011 | Dunn et al. |
| 11,368,804 | B1* | 6/2022 | Liu .............. H04R 19/005 |
| 2006/0139642 | A1 | 6/2006 | Van Bilsen |
| 2009/0153158 | A1 | 6/2009 | Dunn et al. |
| 2009/0212882 | A1 | 8/2009 | De La Puente et al. |
| 2009/0303141 | A1* | 12/2009 | Kosdikian ......... G01R 29/0821 343/703 |
| 2012/0313618 | A1 | 12/2012 | Phillips |

(Continued)

FOREIGN PATENT DOCUMENTS

| | | |
|---|---|---|
| CN | 104981941 A | 10/2015 |
| CN | 105980867 A | 9/2016 |

(Continued)

OTHER PUBLICATIONS

Non-Final Office Action for U.S. Appl. No. 16/184,879 , dated May 8, 2020, 26 pages. May 8, 2020.

(Continued)

*Primary Examiner* — Giovanni Astacio-Oquendo
(74) *Attorney, Agent, or Firm* — Foley & Lardner LLP

(57) ABSTRACT

A testing device includes a testing socket and a reflector. The testing socket defines an accommodating space. The reflector is disposed in the accommodating space and has a plurality of reflection surfaces non-parallel with each other. The reflection surfaces define a transmission space.

20 Claims, 19 Drawing Sheets

(56) References Cited

U.S. PATENT DOCUMENTS

| | | | |
|---|---|---|---|
| 2013/0293249 A1* | 11/2013 | Han | G01R 31/2822 324/750.02 |
| 2014/0203829 A1 | 7/2014 | Yamada | |
| 2015/0015294 A1 | 1/2015 | Tan et al. | |
| 2015/0048980 A1 | 2/2015 | Chin | |
| 2015/0168486 A1 | 6/2015 | Isaac et al. | |
| 2015/0234005 A1* | 8/2015 | Kim | G01R 31/2891 324/750.08 |
| 2015/0280328 A1 | 10/2015 | Sanford et al. | |
| 2015/0333804 A1 | 11/2015 | Yang et al. | |
| 2015/0355233 A1* | 12/2015 | Lee | G01R 31/2886 324/756.02 |
| 2016/0025788 A1 | 1/2016 | Fujita et al. | |
| 2016/0154023 A1* | 6/2016 | Choi | G01R 1/0466 324/750.2 |
| 2017/0012714 A1* | 1/2017 | Kildal | G01R 29/0821 |
| 2017/0102409 A1 | 4/2017 | Sarhad et al. | |
| 2019/0068300 A1* | 2/2019 | Lu | G01R 31/3025 |
| 2022/0057433 A1* | 2/2022 | Oh | G01R 1/0466 |
| 2022/0196509 A1* | 6/2022 | Kishi | F16L 55/1283 |

FOREIGN PATENT DOCUMENTS

| | | | |
|---|---|---|---|
| EP | 3779477 A2 * | 2/2021 | ............ G01R 29/10 |
| TW | 200946931 A | 11/2009 | |
| TW | 201250273 A | 12/2012 | |
| TW | M571967 U | 12/2018 | |

OTHER PUBLICATIONS

Notice of Allowance for U.S. Appl. No. 16/184,879, dated Nov. 18, 2020, 19 pages.

Office Action in counterpart Taiwan Patent Application No. 107128918, dated May 11, 2022, 9 pages.

Search Report (with English translation) in counterpart Taiwan Patent Application No. 107128918, dated May 11, 2022, 2 pages.

Office Action in counterpart Chinese Patent Application No. 201811197111.0, dated Apr. 22, 2022, 8 pages.

Search Report (with English translation) in counterpart Chinese Patent Application No. 201811197111.0, dated Apr. 22, 2022, 6 pages.

* cited by examiner

TESTING DEVICE, TESTING SYSTEM, AND TESTING METHOD

CROSS-REFERENCE TO RELATED APPLICATIONS

This application claims the benefit of and priority to U.S. Provisional Patent Application 62/591,674, filed on Nov. 28, 2017, which is incorporated herein by reference in its entirety.

BACKGROUND

1. Field of the Disclosure

The present disclosure relates to a testing device, a testing system, and a testing method, and to a testing device, a testing system, and a testing method used to test a wireless module using a non-contact technique.

2. Description of the Related Art

A wireless module (e.g., an mmWave RF wireless module) may be tested over the air (OTA). Such testing may be performed in a testing room (or a testing chamber), in which a plurality of absorbers are disposed (e.g. on inner surfaces thereof). Such a testing room (or testing chamber) can be large. For example, a size thereof may be 6 meters (m)*6 m*6 m, or 60 centimeters (cm)*60 cm*60 cm. In addition, such testing may take a long time. Therefore, such testing may be unsuitable for testing devices as part of a mass production process.

SUMMARY

According to one aspect, in some embodiments, a testing device includes a testing socket and a reflector. The testing socket defines an accommodating space. The reflector is disposed in the accommodating space and has a plurality of reflection surfaces non-parallel with each other. The reflection surfaces define a transmission space.

According to another aspect, in some embodiments, a testing device includes a testing fixture and a device holder. The testing fixture defines a first opening and a second opening opposite to the first opening, and has a plurality of reflection surfaces. The reflection surfaces define a transmission space between the first opening and the second opening. The device holder is disposed in the transmission space and defines an upper opening. The device holder includes at least one first signal transmission portion and a second signal transmission portion. The upper opening of the device holder corresponds to the first opening of the testing fixture. The first signal transmission portion and the second signal transmission portion define a receiving space, and the second signal transmission portion is opposite to the upper opening.

According to another aspect, in some embodiments, a testing system includes a testing device, a circuit board and a tester. The testing device includes a testing socket, a reflector and a device holder. The testing socket defines a first opening, a second opening opposite to the first opening and an accommodating space between the first opening and the second opening. The reflector is disposed in the accommodating space and has a plurality of reflection surfaces. The device holder is disposed in the accommodating space and defines a receiving space to accommodate a device under test (DUT). The device holder includes at least one first signal transmission portion and a second signal transmission portion. The circuit board is disposed above the first opening of the testing socket and configured to electrically connect to the DUT. The tester is disposed under the second opening of the testing socket and electrically connected to the circuit board. The tester includes a test antenna corresponding to the second opening of the testing socket.

According to another aspect, in some embodiments, a testing method includes: (a) providing a test board and a DUT, the DUT including a first surface and a second surface opposite the first surface and a plurality of electrical contacts disposed adjacent to the first surface; and (b) applying a suction on the first surface of the DUT so that the electrical contacts of the DUT are electrically connected to the test board.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
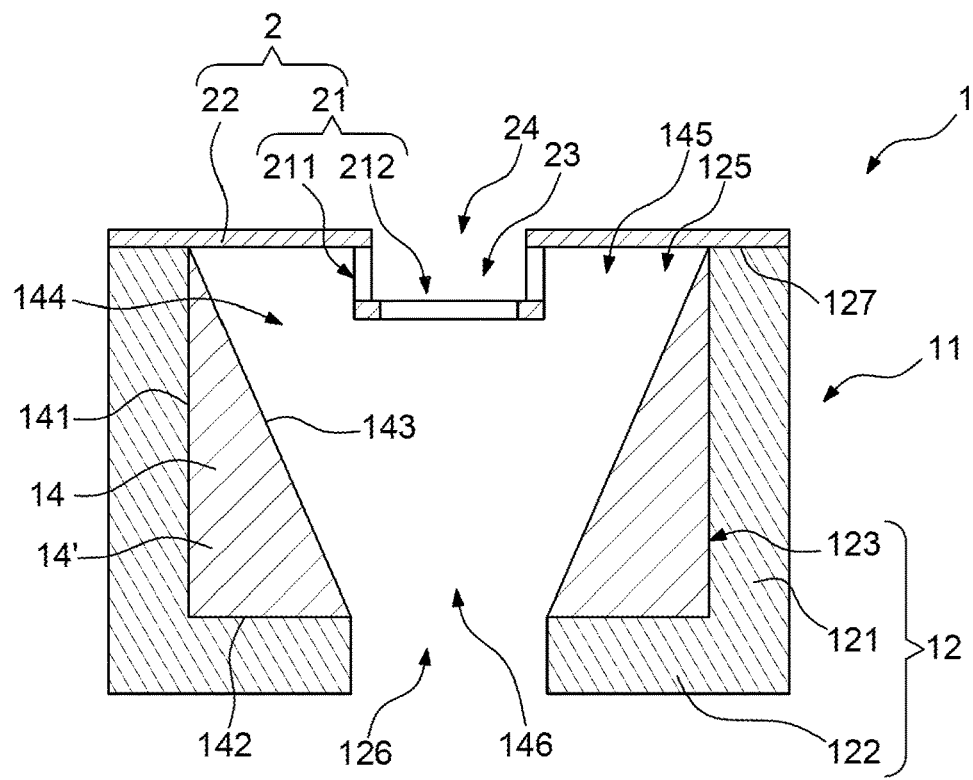
FIG. 1 illustrates a cross-sectional view of a testing device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description provided herein may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples provided herein. This repetition is for the purpose of simplicity and clarity and does not in itself dictate a relationship between the various embodiments and/or configurations discussed.

In a comparative testing process, a DUT may have a first surface and a second surface opposite to the first surface. The DUT may include a plurality of solder bumps and an antenna. The solder bumps may be disposed on the first surface, and the antenna may be disposed on the second surface. During the testing process, a testing fixture picks up the DUT from the second surface of the DUT. Thus, a hard material (e.g. a metal material) of the testing fixture may contact the antenna on the second surface. Thus, the efficiency of the antenna may be negatively influenced (e.g. via deformation of the antenna).

If the DUT includes a plurality of antennas, the antennas of the DUT may emit signals from different directions. However, a test antenna that is used to receive the signals from the antennas of the DUT may be at a fixed location. Thus, during the testing process, the testing fixture with the DUT may be rotated by 360 degrees so that all of the signals from the DUT can be received by the test antenna. It can be difficult to design such a testing fixture.

The present disclosure provides for a testing device which be used in a production line during mass production. In some embodiments, the testing device includes a reflector disposed in an accommodating space of a testing socket so that the reflector may reflect the signals from the DUT to the test antenna. A size of the testing device can thus be reduced efficiently. At least some embodiments of the present disclosure provide for a testing method that provides a suction force on a first surface of the DUT so that the electrical contacts on the first surface of the DUT are electrically connected to a test board.

Figure 2:
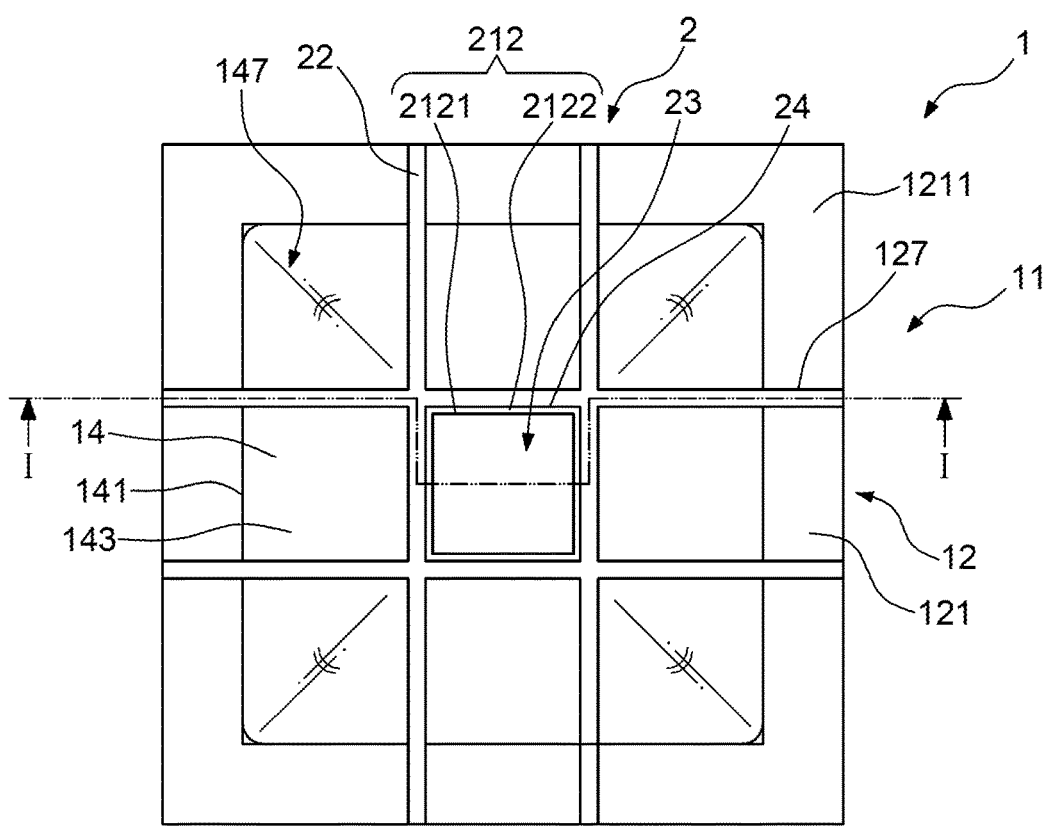
FIG. 2 illustrates a top view of the testing device shown in FIG. 1.

FIG. 1 illustrates a cross-sectional view of a testing device 1 according to some embodiments of the present disclosure. FIG. 2 illustrates a top view of the testing device 1 shown in FIG. 1. It is noted that FIG. 1 is a cross-sectional view taken along line I-I of FIG. 2. The testing device 1 includes a testing fixture 11 (including, for example, a testing socket 12 and a reflector 14) and a device holder 2.

The testing socket 12 defines an accommodating space 123, a first opening 125 and a second opening 126. The second opening 126 is opposite to the first opening 125, and the accommodating space 123 is disposed between the first opening 125 and the second opening 126. The accommodating space 123, the first opening 125 and the second opening 126 are in communication with each other. In some embodiments, the testing socket 12 includes one or more side walls 121 (e.g. four side walls 121) and a bottom wall 122. The respective top portions of the side walls 121 may define the first opening 125. The side walls 121 may connect to the bottom wall 122 to define the accommodating space 123. The bottom wall 122 may define the second opening 126. As shown in FIG. 1, the second opening 126 may be located at a center of the bottom wall 122 and may extend through the bottom wall 122. A width of the first opening 125 is greater than a width of the second opening 126 (e.g. by a factor of about 1.3 or more, about 1.5 or more, or about 2 or more). In some embodiments, the side walls 121 and the bottom wall 122 are formed integrally as a monolithic structure. In addition, the testing socket 12 may further define a plurality of slots 127 in a top (e.g., an upper surface 1211) of the side walls 121 for receiving an extending portion 22 of the device holder 2.

The reflector 14 is disposed in the accommodating space 123 of the testing socket 12 and includes a plurality of reflection surfaces 143 non-parallel with each other. The reflection surfaces 143 are slanted surfaces and define a transmission space 144. As shown in FIG. 1, the reflector 14 defines a first opening 145 and a second opening 146 opposite to the first opening 145, and a width of the first opening 145 is different from a width of the second opening 146. A width of the first opening 145 is greater than a width of the second opening 146 (e.g. by a factor of about 1.3 or more, about 1.5 or more, or about 2 or more), and the transmission space 144 is disposed between the first opening 145 and the second opening 146. The transmission space 144, the first opening 145 and the second opening 146 are in communication with each other.

A material of the reflector 14 may include a metal such as aluminum, copper, iron or steel, another reflective metal, or an alloy thereof. In some embodiments, the reflection surfaces 143 of the reflector 14 are flat surfaces or curved surfaces. In some embodiments, one reflection surface 143 may include two or more sub-surfaces non-parallel with each other. The reflector 14 may include four curved corner surfaces 147, and each of the curved corner surfaces 147 is disposed between two reflection surfaces 143 (in a clockwise manner). Thus, there may be no flat, slanted surface disposed between two reflection surfaces 143 (in a clockwise manner). In some embodiments, the reflector 14 includes four reflection portions 14'. A cross section of each of the reflection portions 14' is triangular, and all of the reflection portions 14' may be formed integrally as a monolithic structure. The reflector 14 may be formed integrally as a monolithic structure. Each of the reflection portions 14' has the reflection surface 143, an outer surface 141 and a bottom surface 142. Thus, the reflector 14 has four outer surfaces 141 and a bottom surface 142. The first opening 145 is defined by top edges of the four reflection portions 14', and the second opening 146 is defined by bottom inner edges of the four reflection portions 14'. When the reflector 14 is placed in the testing socket 12, the outer surfaces 141 and the bottom surface 142 of the reflector 14 contact the inner surfaces of the side walls 121 and the bottom wall 122 of the testing socket 12, respectively. Further, the first opening 145 of the reflector 14 corresponds to, and is aligned with, the first opening 125 of the testing socket 12, and second opening 146 of the reflector 14 corresponds to, and is aligned with, the second opening 126 of the testing socket 12. Thus, the second opening 126 of the testing socket 12 is in communication with the transmission space 144 of the reflector 14. As shown in FIG. 1, the reflection surfaces 143 extend between the inner edge of the top of the side walls 121 of the testing socket 12 and the top edge of the side wall of the second opening 126 of the testing socket 12.

The device holder 2 is disposed in the transmission space 144 of the reflector 14 of the testing fixture 11, and is supported by the testing fixture 11 (by, for example, the testing socket 12 or the reflector 14). As shown in FIG. 1, the device holder 2 includes a receiving portion 21 and an extending portion 22. The receiving portion 21 defines a receiving space 23 for receiving a DUT 4 (see FIG. 20). The extending portion 22 extends from the receiving portion 21 to the upper surface 1211 of the testing socket 12 of the testing fixture 11. In some embodiments, the extending portion 22 may be positioned in, or couple with, the slot 127 of the side wall 121 of the testing socket 12. As shown in FIG. 1 and FIG. 2, the device holder 2 is disposed in the accommodating space 123 and in the transmission space 144, so that the receiving space 23 is surrounded by the reflection surfaces 143 of the reflector 14, and the reflection surfaces of the reflector 14 face the receiving space 23 of the device holder 2.

In addition, the receiving portion 21 of the device holder 2 defines an upper opening 24. The upper opening 24 of the device holder 2 corresponds to the first opening 125 of the testing socket 12 of the testing fixture 11 and the first opening 145 of the reflector 14 of the testing fixture 11. In addition, the receiving portion 21 of the device holder 2 includes at least one or more first signal transmission portions 211 and a second signal transmission portion 212. The first signal transmission portions 211 connect to the second signal transmission portion 212, and the first signal transmission portions 211 and the second signal transmission portion 212 together define the receiving space 23. The second signal transmission portion 212 is opposite to the upper opening 24. As shown in FIG. 1 and FIG. 2, the receiving portion 21 of the device holder 2 includes four first signal transmission portions 211 corresponding to the four lateral sides of the receiving portion 21 respectively. The second signal transmission portion 212 corresponds to the bottom side of the receiving portion 21. In addition, the extending portion 22 extends from the first signal transmission portion 211 to the upper surface 1211 of the testing socket 12 of the testing fixture 11.

Figure 3:
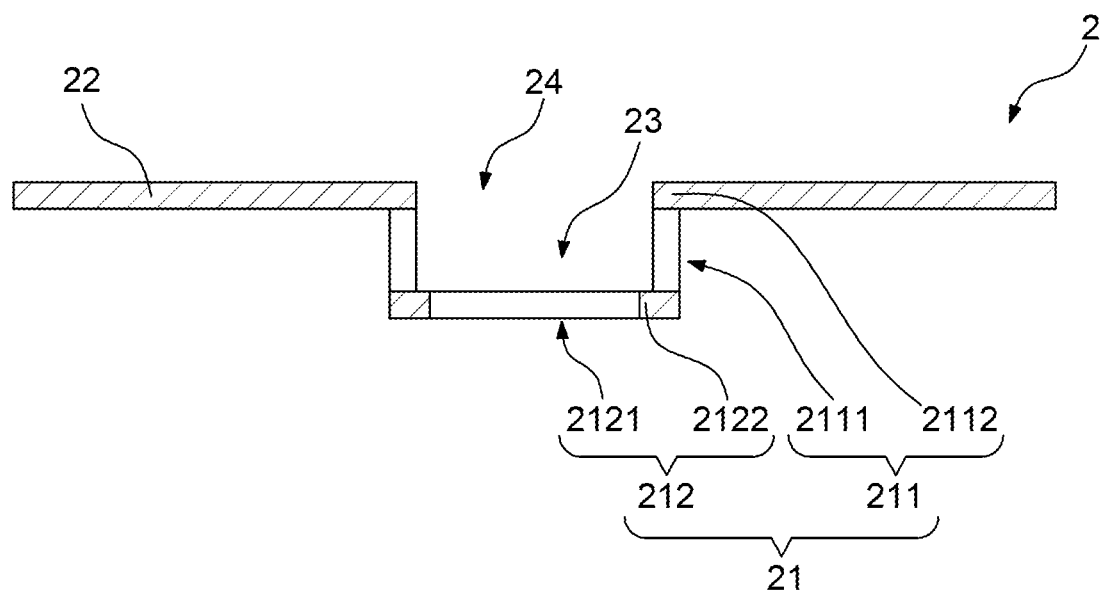
FIG. 3 illustrates a cross-sectional view of a device holder of the testing device of FIG. 1.
Figure 4:
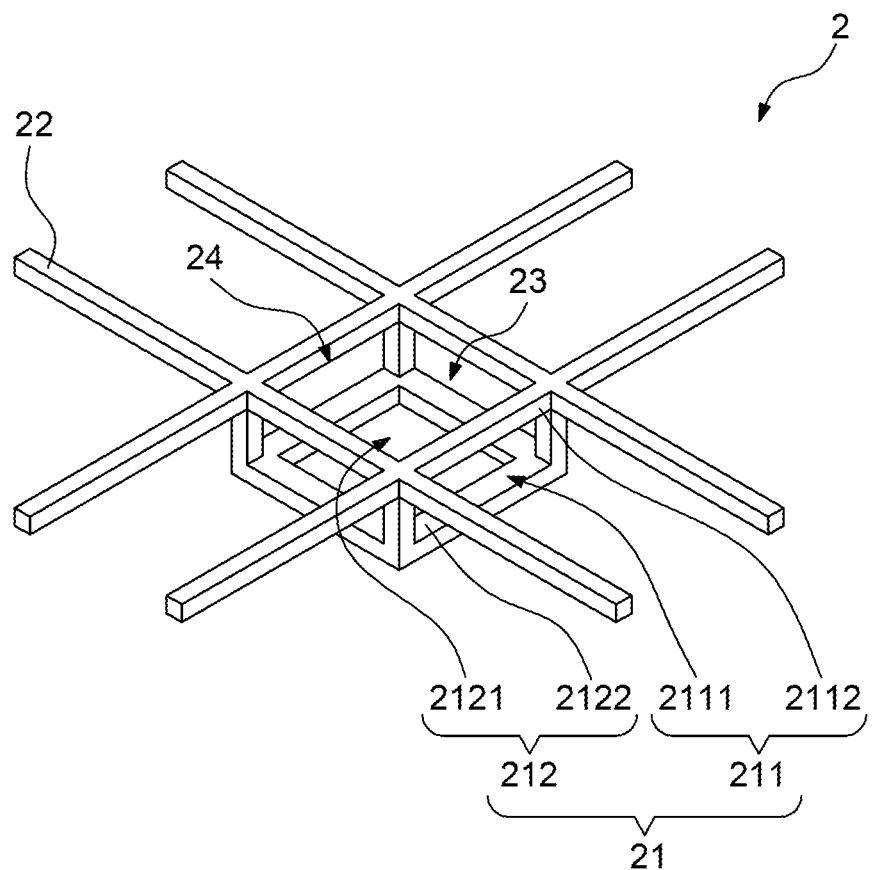
FIG. 4 illustrates a perspective view of the device holder shown in FIG. 3.

FIG. 3 illustrates a cross-sectional view of the device holder 2 of the testing device 1 of FIG. 1. FIG. 4 illustrates a perspective view of the device holder 2 shown in FIG. 3. The device holder 2 may include a plurality of strips or bars and may be formed integrally as a monolithic structure. In some embodiments, a material of the device holder 2 may be, for example, a plastic, wood, an acrylic or an aerogel. The first signal transmission portion 211 of the receiving portion 21 defines a lateral opening 2111, and includes the lateral opening 2111 and a first strip portion 2112. The second signal transmission portion 212 of the receiving portion 21 defines a lower opening 2121, and includes the lower opening 2121 and a second strip portion 2122. The second strip portion 2122 can hold the bottom edge of the DUT 4 (see FIG. 20). Thus, the receiving space 23 of the device holder 2 is communicated with the transmission space 144 of the reflector 14 (see FIG. 1) through the lower opening 2121 and the lateral opening 2111. The device holder 2 of FIG. 3 and FIG. 4 can be referred to as a "net bag type".

Figure 5:
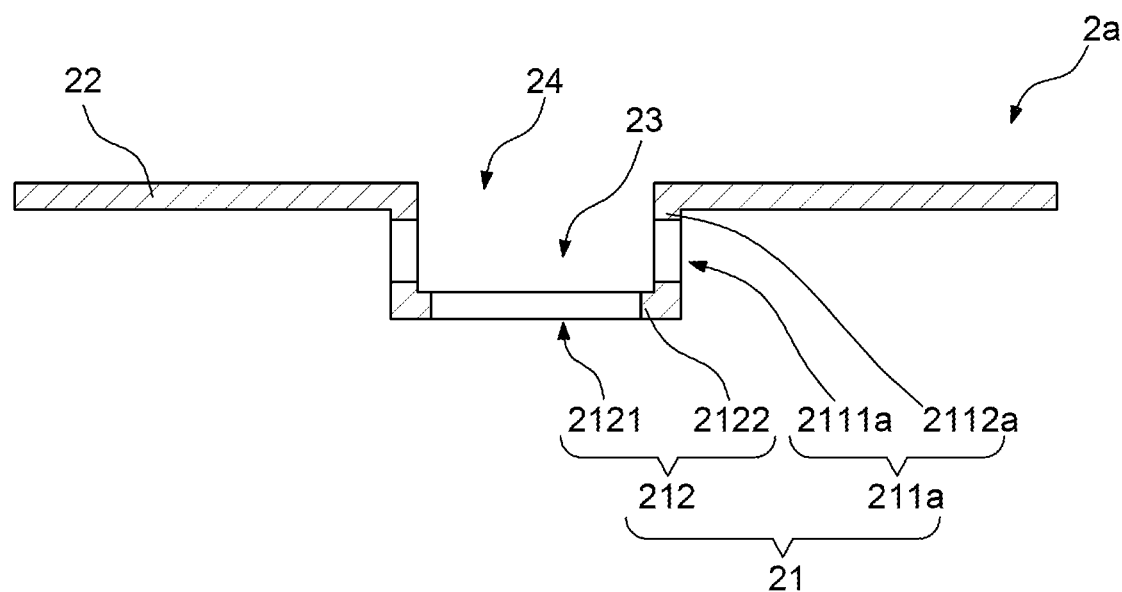
FIG. 5 illustrates a cross-sectional view of a device holder according to some embodiments of the present disclosure.
Figure 6:
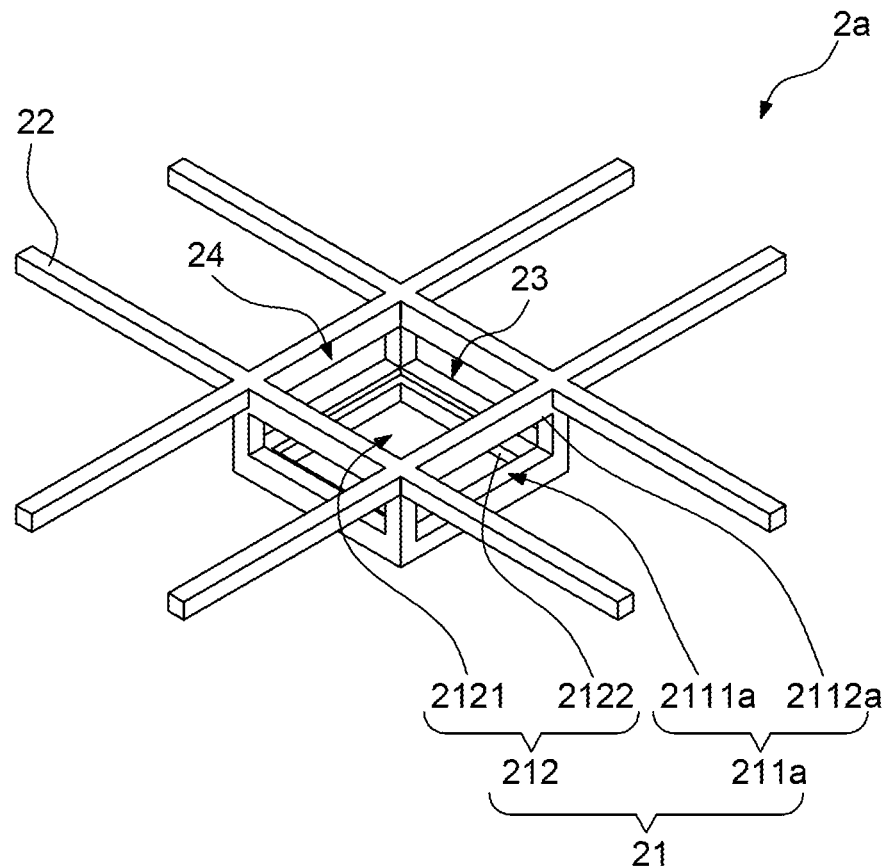
FIG. 6 illustrates a perspective view of the device holder shown in FIG. 5.

FIG. 5 illustrates a cross-sectional view of a device holder 2a according to some embodiments of the present disclosure. FIG. 6 illustrates a perspective view of the device holder 2a shown in FIG. 5. The device holder 2a is similar to the device holder 2 shown in FIG. 3 and FIG. 4, but differs as follows. As shown in FIG. 5 and FIG. 6, the first signal transmission portions 211 may include a first signal transmission portion 211a, and a first strip portion 2112a of the first signal transmission portion 211a extends toward a lateral opening 2111a. Thus, a size of the lateral opening 2111a of the first signal transmission portion 211a of FIG. 5 and FIG. 6 is smaller than a size of the lateral opening 2111 of the first signal transmission portion 211 of FIG. 3 and FIG. 4. The extended first strip portion 2112a can hold the lateral side surface 47 of the DUT 4 (see FIG. 20).

Figure 7:
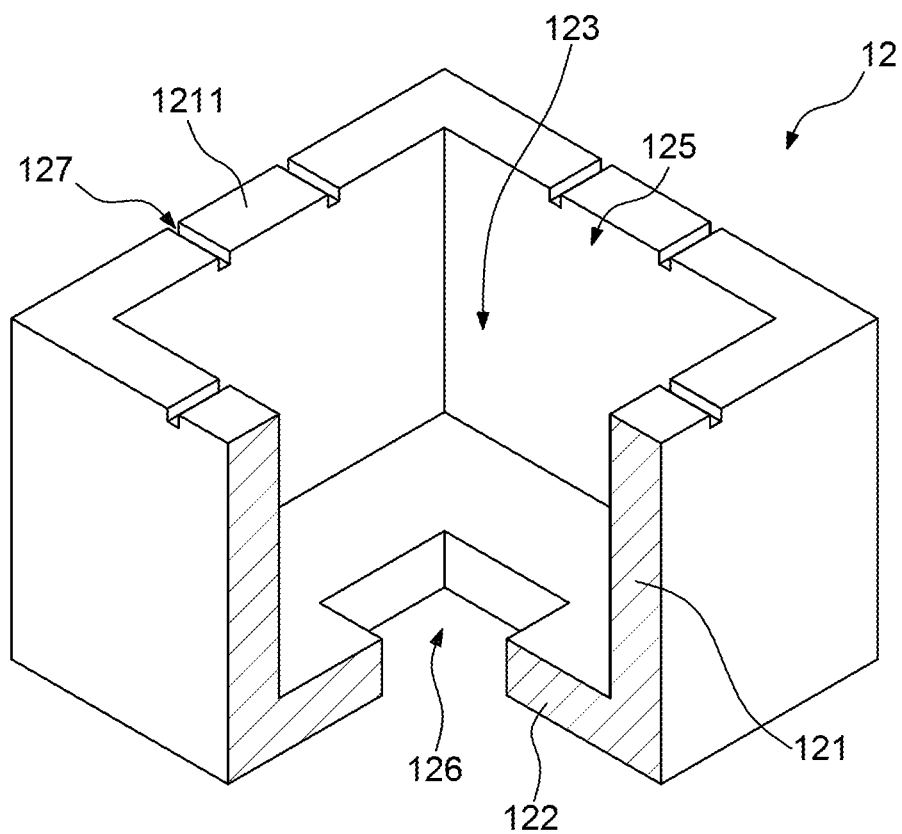
FIG. 7 illustrates a perspective view of a testing socket of the testing device of FIG. 1.

FIG. 7 illustrates a perspective view of the testing socket 12 of the testing device 1 of FIG. 1. The testing socket 12 may include four side walls 121 and a bottom wall 122. The top portions of the side walls 121 may define the first opening 125. The side walls 121 may connect to the bottom wall 122 to define the accommodating space 123. The bottom wall 122 may define the second opening 126. The second opening 126 may be located at the center of the bottom wall 122 and may extend through the bottom wall 122. A width of the first opening 125 is greater than a width of the second opening 126 (e.g. by a factor of about 1.3 or more, about 1.5 or more, or about 2.0 or more). In some embodiments, the side walls 121 and the bottom wall 122 are formed integrally as a monolithic structure. In addition, the testing socket 12 may further define a plurality of slots 127 in the top (e.g., an upper surface 1211) of the side walls 121 for receiving the extending portion 22 of the device holder 2.

Figure 8:
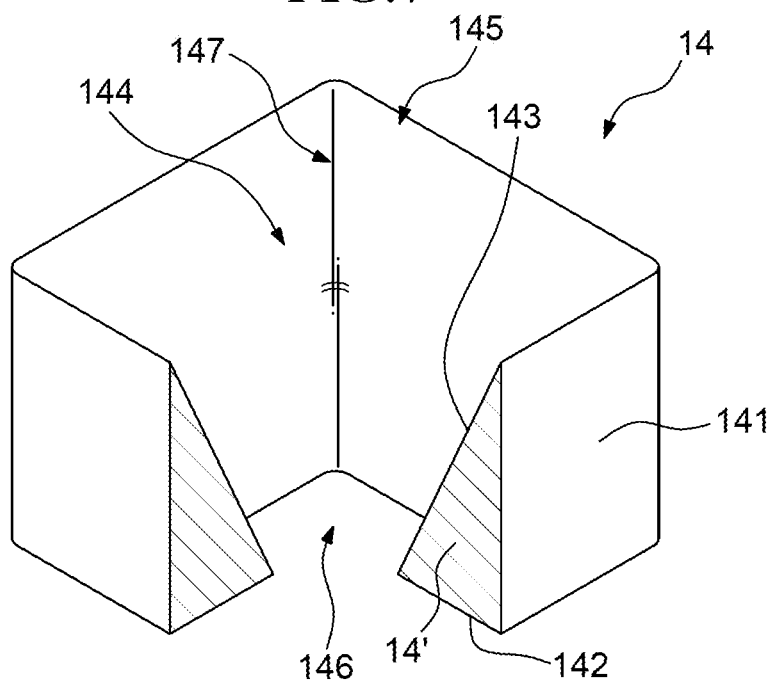
FIG. 8 illustrates a perspective view of a reflector of the testing device of FIG. 1.

FIG. 8 illustrates a perspective view of the reflector 14 of the testing device 1 of FIG. 1. The reflector 14 may include four reflection surfaces 143 non-parallel with each other, and define the first opening 145, the second opening 146 opposite to the first opening 145, and the transmission space 144 between the first opening 145 and the second opening 146. A width of the first opening 145 is greater than a width of the second opening 146 (e.g. by a factor of about 1.3 or more, about 1.5 or more, or about 2.0 or more). In addition, the reflector 14 may further include four curved corner surfaces 147, and each of the curved corner surfaces 147 is disposed between two reflection surfaces 143 (in a clockwise manner). Thus, there may be no flat, slanted surface disposed between two reflection surfaces 143 (in a clockwise manner). In some embodiments, the reflector 14 may be formed integrally as a monolithic structure. The reflector 14 has one or more outer surfaces 141 (e.g. four outer surfaces 141) and a bottom surface 142. The first opening 145 is defined by top edges of the four reflection surfaces 143, and the second opening 146 is defined by bottom inner edges of the four reflection surfaces 143.

Figure 9:
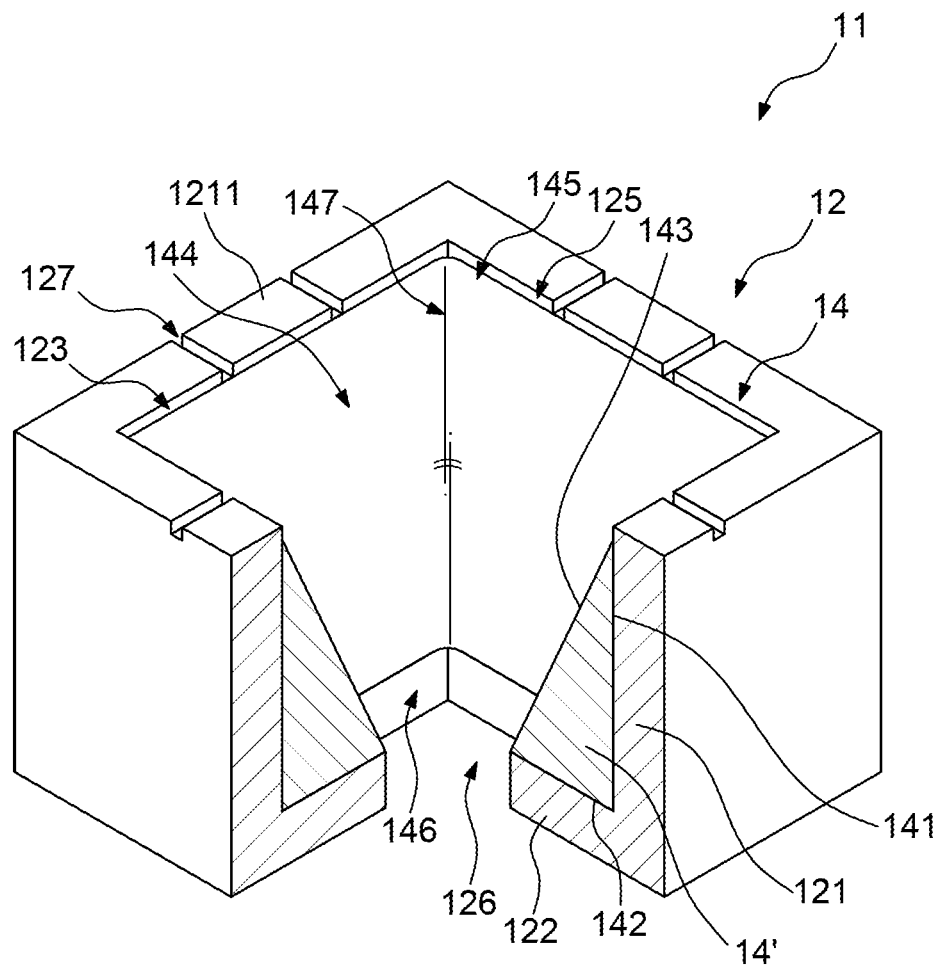
FIG. 9 illustrates a perspective view of a testing fixture of the testing device of FIG. 1.

FIG. 9 illustrates a perspective view of the testing fixture 11 of the testing device 1 of FIG. 1. When the reflector 14 is placed in the accommodating space 123 of the testing socket 12 so as to form the testing fixture 11, the outer surfaces 141 and the bottom surface 142 of the reflector 14 contact the inner surfaces of the side walls 121 and the bottom wall 122 of the testing socket 12, respectively. Further, the first opening 145 of the reflector 14 corresponds to the first opening 125 of the testing socket 12, and second opening 146 of the reflector 14 is aligned with the second opening 126 of the testing socket 12. Thus, the second opening 126 of the testing socket 12 is in communication with the transmission space 144 of the reflector 14.

Figure 10:
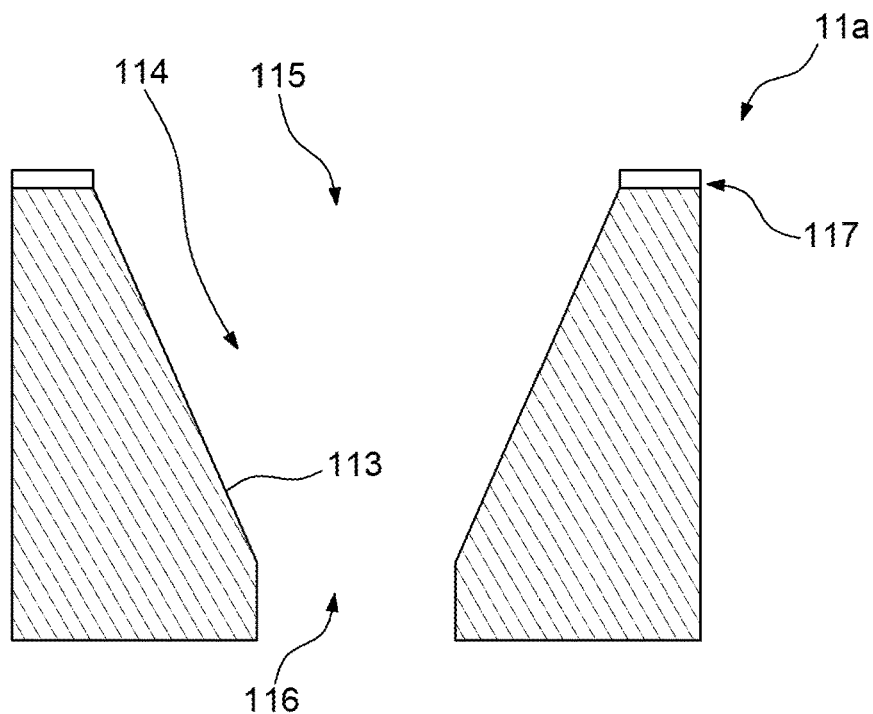
FIG. 10 illustrates a cross-sectional view of a testing fixture according to some embodiments of the present disclosure.

FIG. 10 illustrates a cross-sectional view of a testing fixture 11a according to some embodiments of the present disclosure. The testing fixture 11a is similar to the testing fixture 11 shown in FIG. 1 and FIG. 9, but differs as follows. As shown in FIG. 10, the reflector 14 and the testing socket 12 of FIG. 1 and FIG. 9 may be formed integrally as a monolithic structure to form the testing fixture 11a. That is, the testing fixture 11a is a monolithic structure, and there may be no boundary between the reflector 14 and the testing socket 12 of FIG. 1 and FIG. 9. The testing fixture 11a may define a first opening 115 and a second opening 116 opposite to the first opening 115, and may include a plurality of reflection surfaces 113 defining a transmission space 114 between the first opening 115 and the second opening 116. A width of the first opening 115 is greater than a width of the second opening 116 (e.g. by a factor of about 1.3 or more, about 1.5 or more, or about 2.0 or more). The testing fixture 11a may further define a plurality of slots 117 on a top (e.g., an upper surface) thereof for receiving the extending portion 22 of the device holder 2. A material of the testing fixture 11a may be a reflective material such as a metal. Thus, the reflection surfaces 113 can reflect electromagnetic signals.

Figure 11:
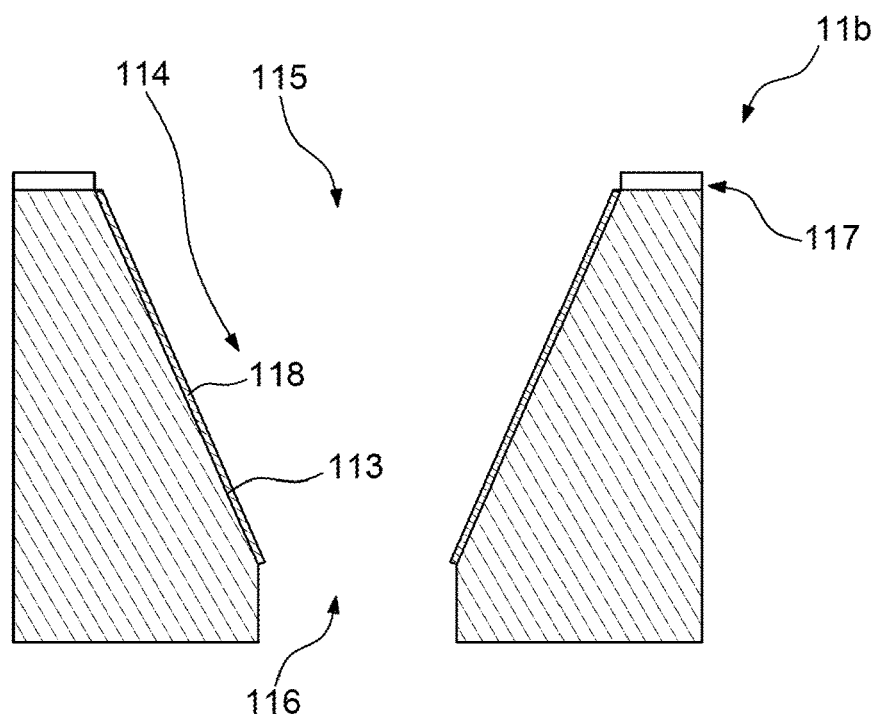
FIG. 11 illustrates a cross-sectional view of a testing fixture according to some embodiments of the present disclosure.

FIG. 11 illustrates a cross-sectional view of a testing fixture 11b according to some embodiments of the present disclosure. The testing fixture 11b is similar to the testing fixture 11a shown in FIG. 10, but differs as follows. As shown in FIG. 11, a material of the testing fixture 11b may include a non-reflective material, and a reflective material 118, such as a metal, is disposed (e.g., coated) on the reflection surfaces 113.

Figure 12:
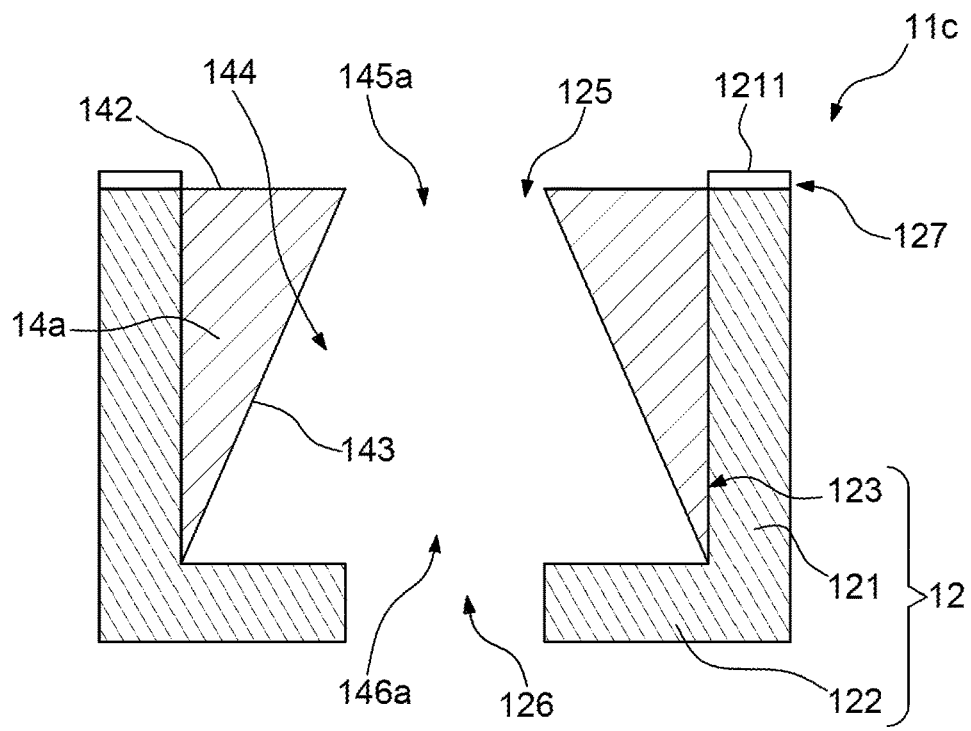
FIG. 12 illustrates a cross-sectional view of a testing fixture according to some embodiments of the present disclosure.

FIG. 12 illustrates a cross-sectional view of a testing fixture 11c according to some embodiments of the present disclosure. The testing fixture 11c is similar to the testing fixture 11 shown in FIG. 1 and FIG. 9, but differs as follows. As shown in FIG. 12, the reflector 14a may be the same as the reflector 14 of FIG. 1 and FIG. 9, but may be disposed inversely. Thus, the bottom surface 142 of the reflector 14a faces upwardly, and does not contact the inner surface of the bottom wall 122 of the testing socket 12. In addition, second opening 146 of FIG. 1 becomes a first opening 145a in FIG. 12, and the first opening 145 of FIG. 1 becomes a second opening 146a in FIG. 12. A width of the first opening 145a is smaller than a width of the second opening 146a (e.g. by a factor of about ¾ or less, about ½ or less, or about ¼ or less). In some embodiments, the reflector 14a and the testing socket 12 may be formed integrally as a monolithic structure. The testing fixture 11c may be formed integrally as a monolithic structure.

Figure 13:
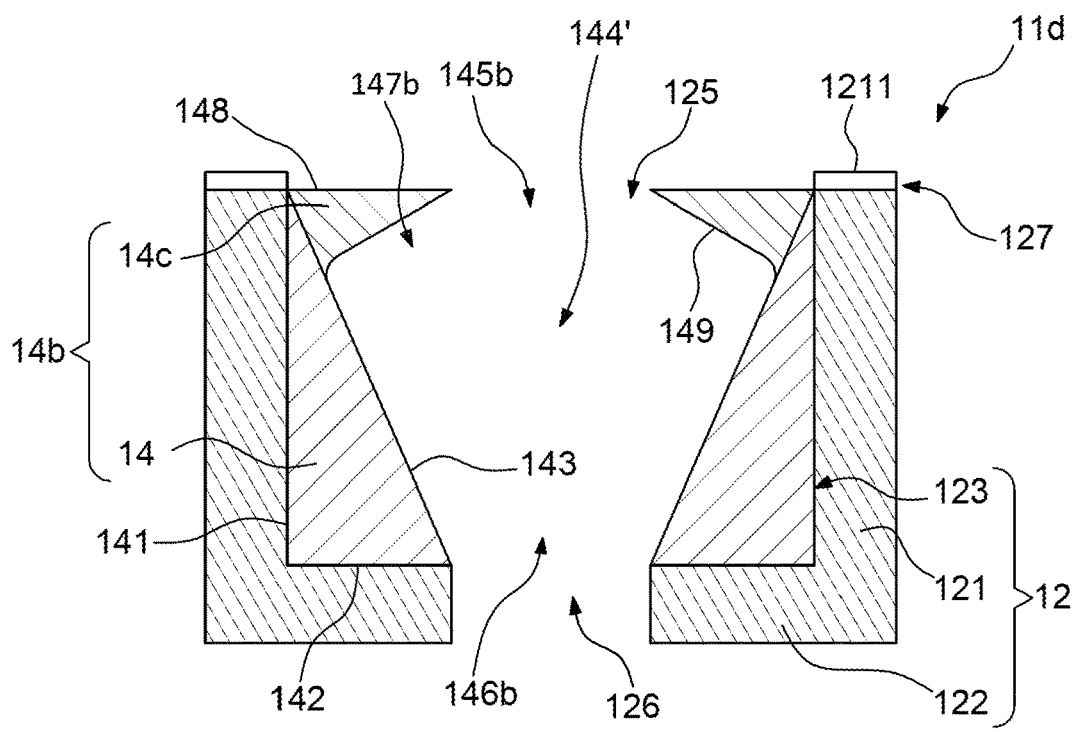
FIG. 13 illustrates a cross-sectional view of a testing fixture according to some embodiments of the present disclosure.

FIG. 13 illustrates a cross-sectional view of a testing fixture 11d according to some embodiments of the present disclosure. The testing fixture 11d is similar to the testing fixture 11 shown in FIG. 1 and FIG. 9, but differs as follows. As shown in FIG. 13, the reflector 14b may include a reflector 14 and an inner ring portion 14c. The reflector 14 of FIG. 13 may be the same as the reflector 14 of FIG. 1 and FIG. 9. The inner ring portion 14c may be disposed on the reflection surfaces 143. A cross section of a portion of the inner ring portion 14c may be substantially triangle shaped. A top surface 148 of the inner ring portion 14c faces upwardly, and defines a first opening 145b. The top surface 148 of the inner ring portion 14c may be substantially parallel with the bottom surface 142 of the reflector 14. The inner ring portion 14c may include a plurality of reflection surfaces 149 substantially intersecting with the reflection surfaces 143 of the reflector 14. One or more joints between one of the reflection surfaces 143 and one of the reflection surfaces 149 may define a curve. The reflection surfaces 149 of the inner ring portion 14c and the uncovered reflection surfaces 143 of the reflector 14 together define a transmission space 144'.

The intersecting portions (joints) between the reflection surfaces 149 of the inner ring portion 14c and the reflection surfaces 143 of the reflector 14 defines a third opening 147b. In addition, the second opening 146 of FIG. 1 becomes a second opening 146b in FIG. 13. Therefore, the reflector 14b defines the first opening 145b, the second opening 146b and the third opening 147b. The third opening 147b is disposed between the first opening 145b and the second opening 146b, and a width of the third opening 147b is not equal to a width of the first opening 145b and the second opening 146b. As shown in FIG. 13, the width of the third opening 147b is greater than the width of the first opening 145b and the second opening 146b (e.g. by a factor of about 1.3 or more, about 1.5 or more, or about 2.0 or more). In some embodiments, the reflector 14 and the inner ring portion 14c may be formed integrally as a monolithic structure. The reflector 14b may be formed integrally as a monolithic structure. In some embodiments, the reflector 14b and the testing socket 12 may be formed integrally as a monolithic structure. The testing fixture 11d may be formed integrally as a monolithic structure.

Figure 14:
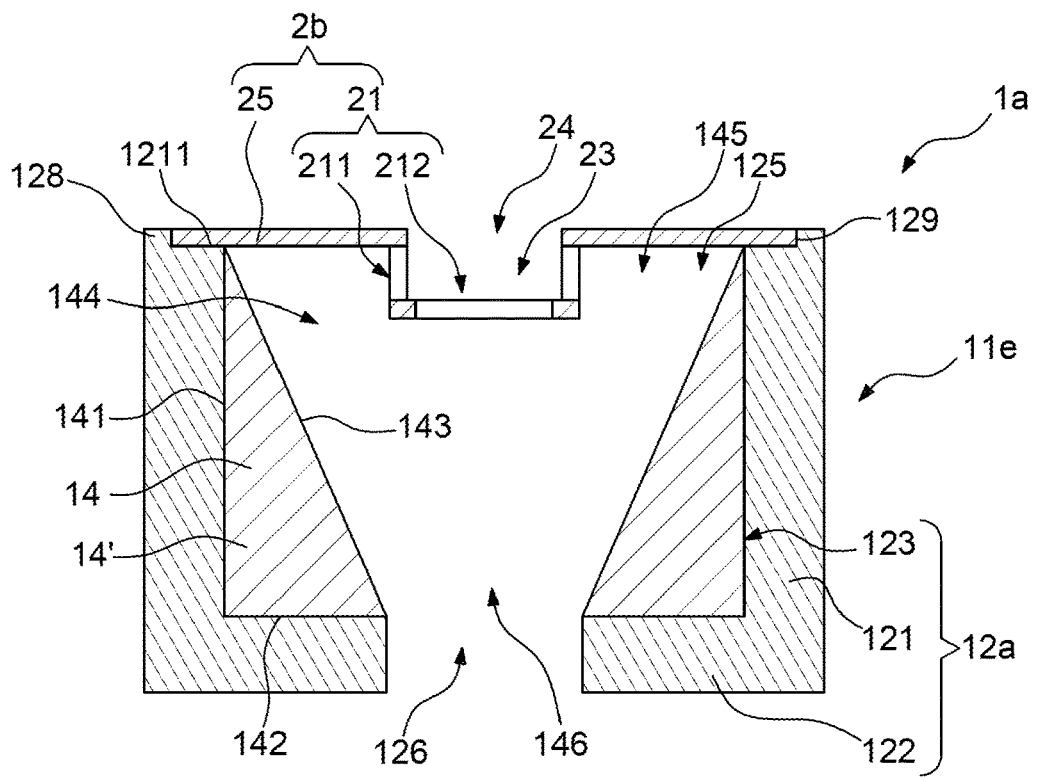
FIG. 14 illustrates a cross-sectional view of a testing device according to some embodiments of the present disclosure.
Figure 15:
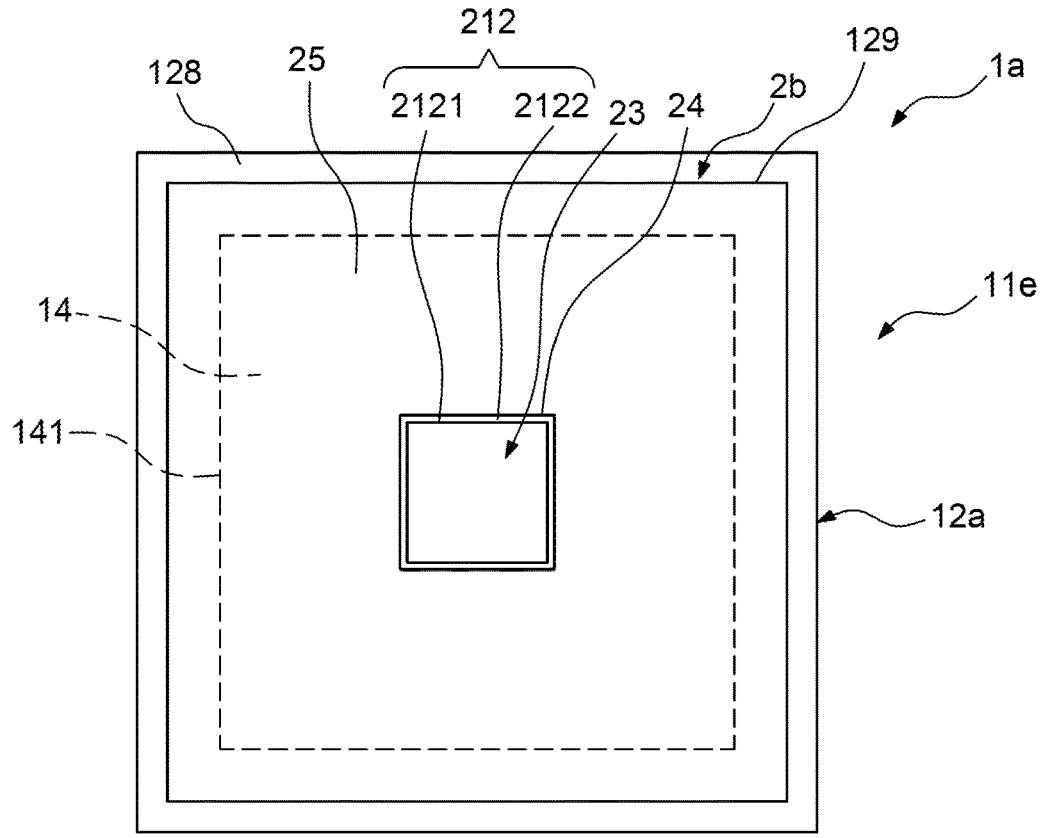
FIG. 15 illustrates a top view of the testing device shown in FIG. 14.

FIG. 14 illustrates a cross-sectional view of a testing device 1a according to some embodiments of the present disclosure. FIG. 15 illustrates a top view of the testing device 1a shown in FIG. 14. The testing device 1a includes a testing fixture 11e (including, for example, a testing socket 12a and a reflector 14) and a device holder 2b. The testing socket 12a is similar to the testing socket 12 of FIG. 1 and FIG. 2, except that the testing socket 12a further includes a protrusion ring 128 protruding from the top (e.g., an upper surface 1211) of the side walls 121 of the testing socket 12a. The protrusion ring 128 and the upper surface 1211 of the side walls 121 of the testing socket 12a together define an accommodating area 129 for receiving an extending portion 25 of the device holder 2b.

The device holder 2b includes a receiving portion 21 and an extending portion 25. The receiving portion 21 of the device holder 2b is the same as the receiving portion 21 of the device holder 2 of FIG. 1 and FIG. 2. That is, the receiving portion 21 of the device holder 2b defines a receiving space 23 and an upper opening 24. The receiving space 23 can be used for receiving a DUT 4 (see FIG. 20). The upper opening 24 of the device holder 2b corresponds to the first opening 125 of the testing socket 12a of the testing fixture 11e and the first opening 145 of the reflector 14 of the testing fixture 11e. The extending portion 25 of the device holder 2b extends from the receiving portion 21 to an upper surface 1211 of the testing socket 12a of the testing fixture 11e. In some embodiments, the extending portion 25 may be positioned in the accommodating area 129. Thus, the bottom of the periphery of the extending portion 25 is supported by the upper surface 1211 of the testing socket 12a of the testing fixture 11e, and the outer side surface of the extending portion 25 is limited by the protrusion ring 128.

Figure 16:
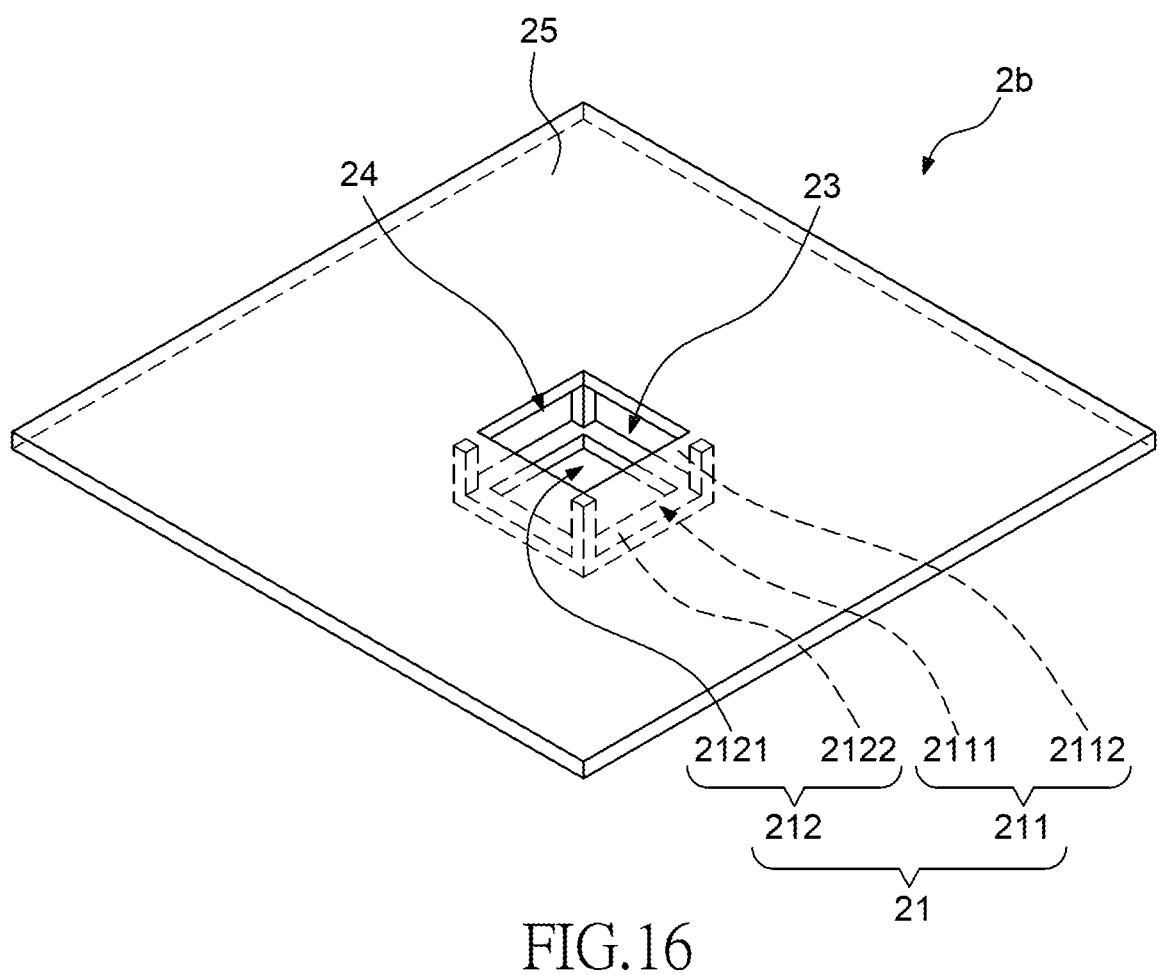
FIG. 16 illustrates a perspective view of a device holder shown in FIG. 14 and FIG. 15.

FIG. 16 illustrates a perspective view of the device holder 2b shown in FIG. 14 and FIG. 15. The device holder 2b is similar to the device holder 2 of FIG. 3 and FIG. 4, except that the extending portion 25 of the device holder 2b is a flat plate with a central through hole corresponding to the receiving portion 21. The device holder 2b can be referred to as a "hat type". The stiffness of the device holder 2b of FIG. 14 through FIG. 16 can sustain greater downward press force than the device holder 2 of FIG. 3 and FIG. 4, and can provide good stability of the position of the DUT.

Figure 17:
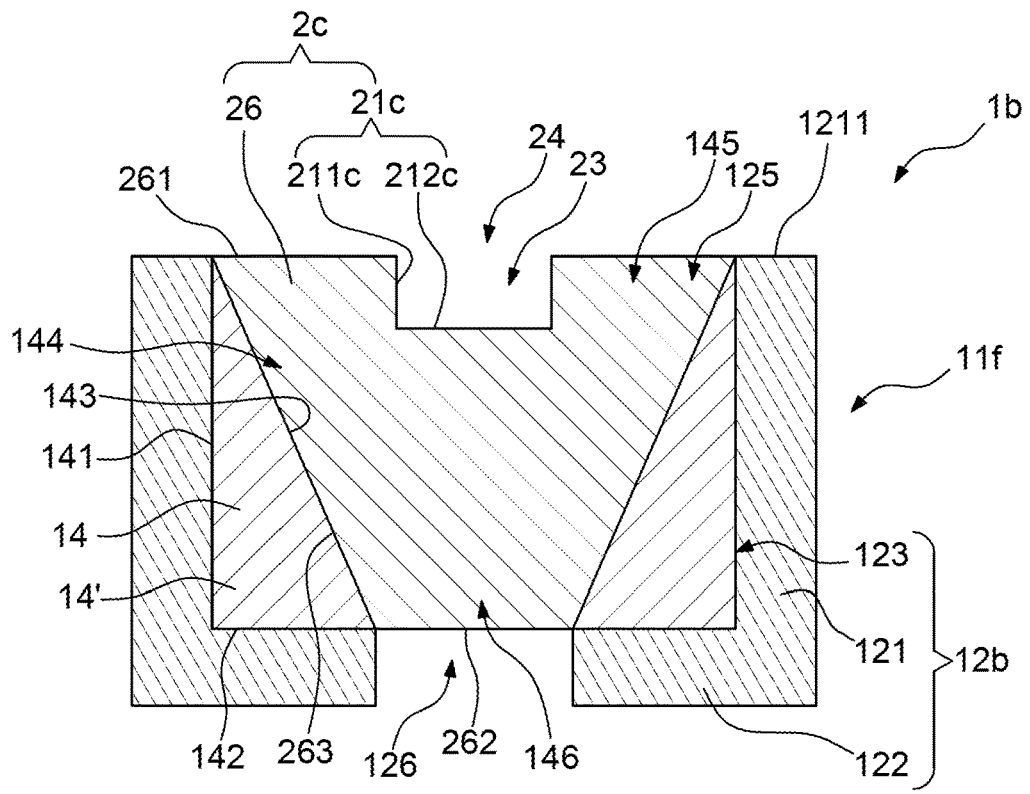
FIG. 17 illustrates a cross-sectional view of a testing device according to some embodiments of the present disclosure.
Figure 18:
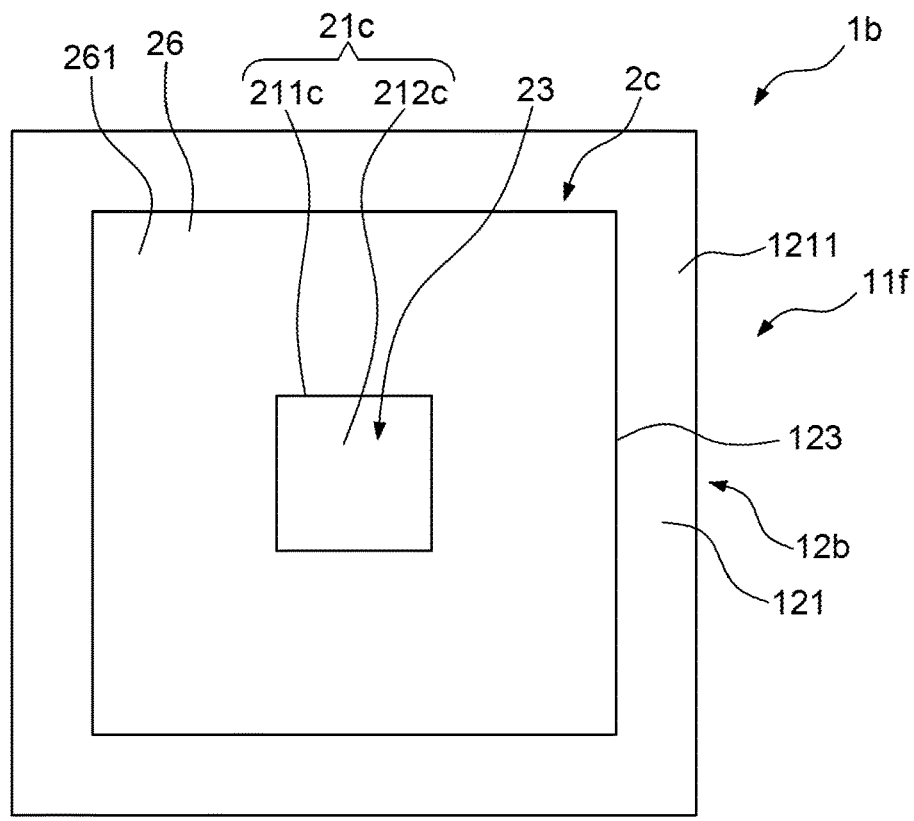
FIG. 18 illustrates a top view of the testing device shown in FIG. 17.

FIG. 17 illustrates a cross-sectional view of a testing device 1b according to some embodiments of the present disclosure. FIG. 18 illustrates a top view of the testing device 1b shown in FIG. 17. The testing device 1b includes a testing fixture 11f (including, for example, a testing socket 12b and a reflector 14) and a device holder 2c. The testing socket 12b is similar to the testing socket 12 of FIG. 1 and FIG. 2, except that the testing socket 12b does not include the slots 127.

The device holder 2c includes a receiving portion 21c and a solid portion 26. The device holder 2c is a solid block structure. The receiving portion 21c of the device holder 2c defines a receiving space 23 and an upper opening 24. The receiving space 23 is used for receiving a DUT. The upper opening 24 of the device holder 2c corresponds to the first opening 125 of the testing socket 12b of the testing fixture 11f and the first opening 145 of the reflector 14 of the testing fixture 11f. The receiving portion 21c of the device holder 2c includes at least one first signal transmission portion 211c and a second signal transmission portion 212c. The first signal transmission portion 211c connects to the second signal transmission portion 212c, and the first signal transmission portion 211c and the second signal transmission portion 212c together define the receiving space 23. The second signal transmission portion 212c is opposite to the upper opening 24. As shown in FIG. 17, the first signal transmission portion 211c may be an inner lateral wall of the receiving portion 21c, and the second signal transmission portion 212c may be an inner bottom wall of the receiving portion 21c.

In addition, the solid portion 26 may have an upper surface 261, a bottom surface 262 and a plurality of outer surfaces 263. The bottom surface 262 is opposite to the upper surface 261, and the outer surface 263 extends between the upper surface 261 and the bottom surface 262. The receiving portion 21c is recessed in the upper surface 261, and the bottom surface 262 faces the second opening 126 of the testing socket 12b. In some embodiments, the solid portion 26 may be positioned in the accommodating space 123 of the testing socket 12b. Thus, the device holder 2c may be supported by the reflection surfaces 143 of the reflector 14 of the testing fixture 11f, and the outer surfaces 263 contact the reflection surfaces 143 of the reflector 14. In some embodiments, a material of the device holder 2c may include a plastic, wood, an acrylic or an aerogel. A size of the device holder 2c may substantially equal to a size of the transmission space 144, and the upper surface 261 may be substantially coplanar with the upper surface 1211 of the testing socket 12b.

Figure 19:
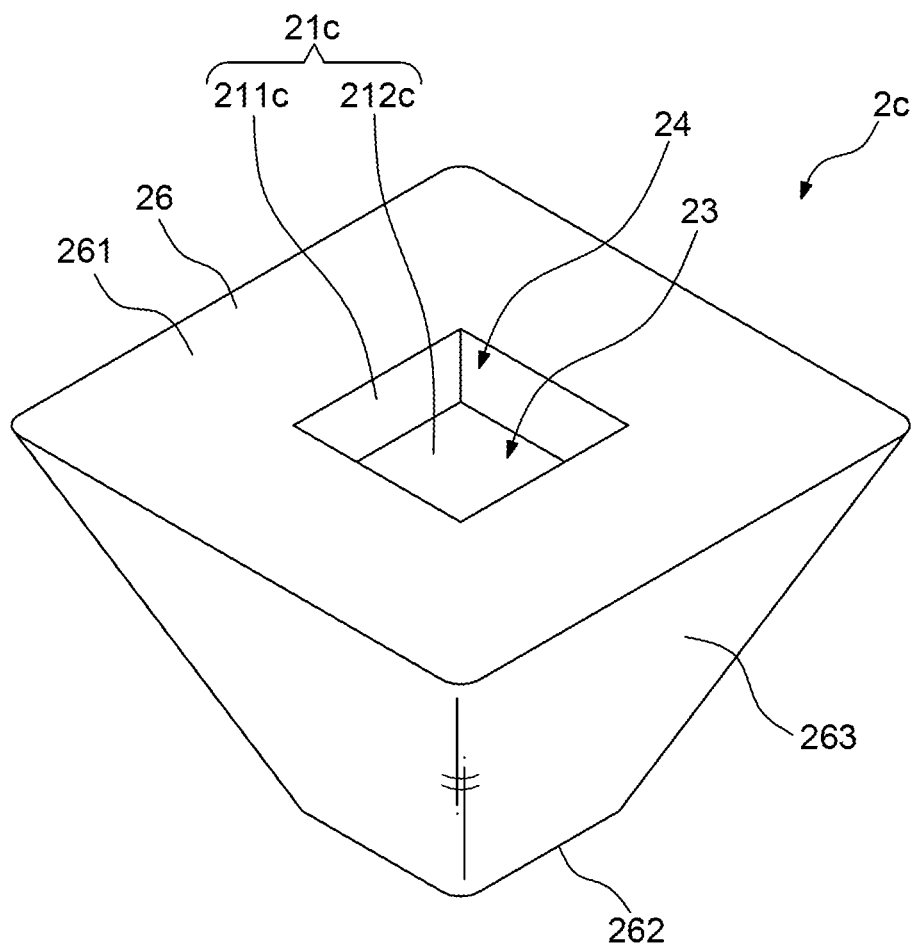
FIG. 19 illustrates a perspective view of a device holder shown in FIG. 17 and FIG. 18.

FIG. 19 illustrates a perspective view of the device holder 2c shown in FIG. 17 and FIG. 18. The device holder 2c is a solid block structure, and is tapered from the upper surface 261 to the bottom surface 262. The stiffness of the device holder 2c of FIGS. 17 to 19 can sustain greater downward press force than can the device holder 2 of FIGS. 3 to 4, and provides excellent stability for the position of the DUT.

Figure 20:
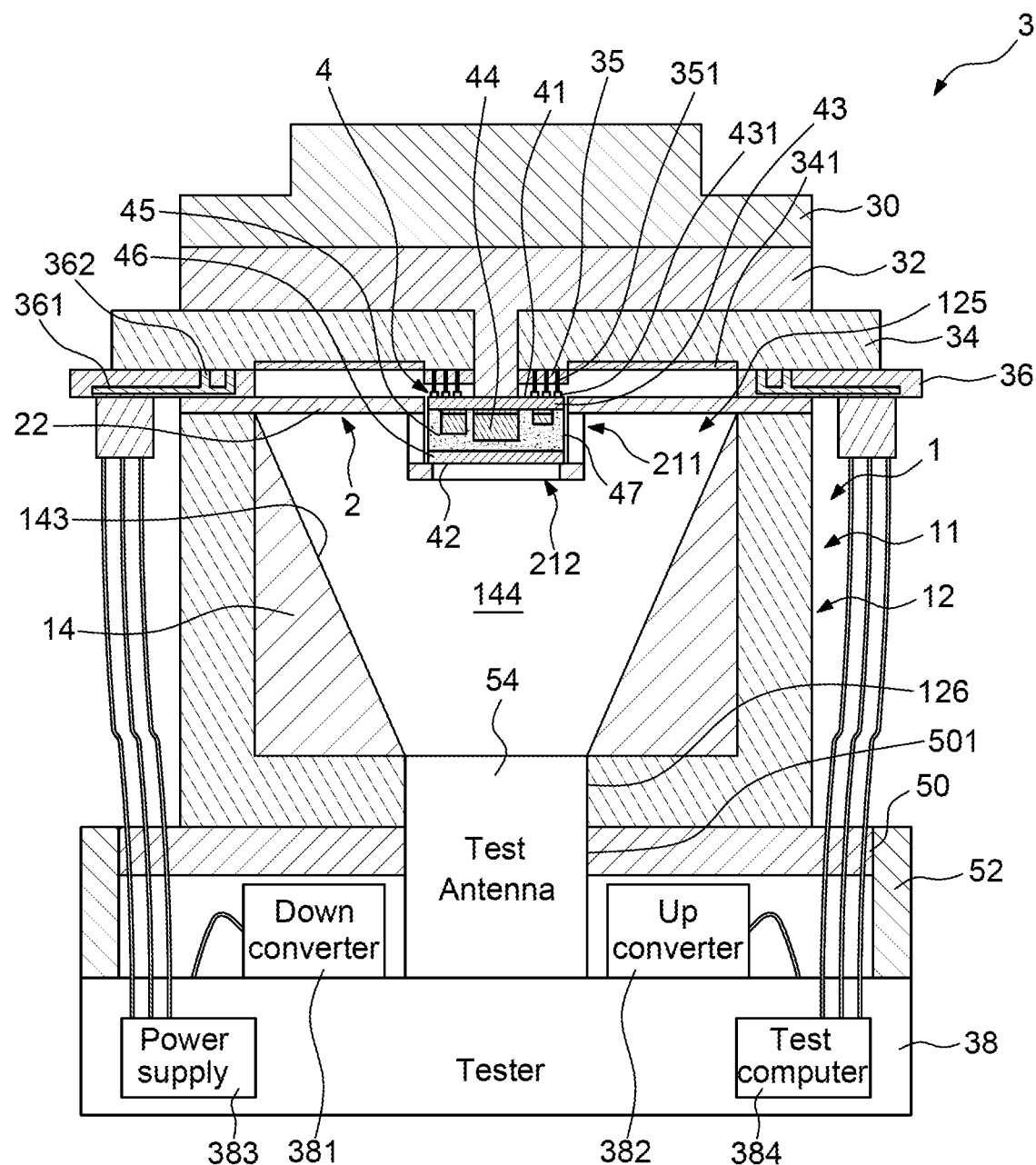
FIG. 20 illustrates a cross-sectional view of a testing system according to some embodiments of the present disclosure.

FIG. 20 illustrates a cross-sectional view of a testing system 3 according to some embodiments of the present disclosure. The testing system 3 includes a testing device 1, a DUT 4, a top circuit board 34 (e.g., a test board), a handler arm 30, a chuck 32, a connecting socket 35, a convertor board 36, a tester 38, a bottom circuit board 50 (e.g., a load board), a board stiffener 52 and a test antenna 54. The testing device 1 of FIG. 20 is the same as the testing device 1 of FIG. 1 and FIG. 2, and includes the testing fixture 11 (including, for example, the testing socket 12 and the reflector 14) and the device holder 2.

The DUT 4 is disposed in the receiving space 23 of the device holder 2, and the DUT 4 includes at least one signal emission source corresponding to at least one of the first signal transmission portion 211 and the second signal transmission portion 212. The signal emission source may have the function of emitting/receiving signals. In some embodiments, the DUT 4 may be a package structure, and may have a first surface 41, a second surface 42 opposite to the first surface 41, and a plurality of lateral side surface 47. The DUT 4 may include a substrate 43, at least one electrical element 44, an encapsulant 45 and an antenna 46. Thus, the DUT 4 is an antenna in package (AiP). For example, the DUT 4 may be a wireless module such as a mmWave wireless module. In one embodiment, the DUT 4 may be a radio frequency (RF) AiP with a frequency of 30 GHz to 80 GHz.

The substrate 43 is disposed adjacent to the first surface 41, and includes a plurality of electrical contacts 431 (e.g., solder balls or solder bumps) disposed adjacent to the upper surface thereof (i.e., the first surface 41). The electrical element 44, such as a semiconductor die and/or a passive element, is electrically connected to the lower surface of the substrate 43. The encapsulant 45, such as a molding compound, covers the lower surface of the substrate 43 and the electrical element 44. The antenna 46 is embedded in or disposed on the encapsulant 45. That is, the antenna 46 is disposed adjacent to the second surface 42 of the DUT 4. The bottom portion of the antenna 46 may be exposed from the second surface 42 of the DUT 4, and a portion of the side portion of the antenna 46 may be exposed from the lateral side surface 47 of the DUT 4. Thus, the lateral side surface 47 of the DUT 4 may be a signal emission source corresponding to the first signal transmission portion 211 of the device holder 2, and the second surface 42 of the DUT 4 may be a signal emission source corresponding to the second signal transmission portion 212 of the device holder 2. As shown in FIG. 20, the antenna 46 may face downward.

The convertor board 36 is disposed on the top portion (e.g., the upper surface 1211) of the testing socket 12 of the testing fixture 11, and on the extending portion 22 of the device holder 2. The convertor board 36 may include at least one circuit layer 361 with a layout line, and a plurality of pogo pins (or other electrical connectors) 362. The convertor board 36 may be in a ring shape, and defines a central through hole to expose the receiving space 21 of the device holder 2.

The top circuit board 34 (e.g., a print circuit board (PCB)) is disposed above the first opening 125 of the testing socket 12 of the testing device 1, and is electrically connected to the convertor board 36 and the DUT 4. In one embodiment, the top circuit board 34 is attached to the handler arm 30 through a chuck 32. The chuck 32 can be used for applying suction to the DUT 4. In one embodiment, the top circuit board 34 includes at least one reflection portion 341 disposed adjacent to a lower surface thereof for reflecting signals. In some embodiments, the reflection portion 341 may be the outermost metal layer of the top circuit board 34, and may be exposed from a protection layer. As shown in FIG. 20, a portion of the extending portion 22 of the device holder 2 is disposed between the testing socket 12 and the top circuit board 34.

The connecting socket 35 is attached to the lower surface of the top circuit board 34, and includes a plurality of testing probes 351. One end of the testing probe 351 is used to contact the electrical contacts 431 of the DUT 4, and the other end of the testing probe 351 is used to contact the top circuit board 34. When the chuck 32 sucks the first surface 41 of the DUT 4, the DUT 4 can be electrically connected to the top circuit board 34 through the electrical contacts 431 and the testing probes 351.

The tester 38, the bottom circuit board 50 and the board stiffener 52 are disposed under the testing device 1. The board stiffener 52 is disposed on the tester 38 and is used for support the bottom circuit board 50. That is, the bottom circuit board 50 is supported by the tester 38 through the board stiffener 52. The testing device 1 is disposed on the bottom circuit board 50. Thus, the bottom circuit board 50 is disposed between the testing device 1 and the tester 38. The bottom circuit board 50 defines a through hole 501 aligned with the second opening 126 of the testing socket 12. In some embodiments, the bottom circuit board 50 may be electrically connected to the top circuit board 34 through the convertor board 36. In some embodiments, the bottom circuit board 50 may be electrically connected to the tester 38.

The tester 38 is electrically connected to the top circuit board 34 through the convertor board 36. The tester 38 includes a test antenna 54, a down converter 381, an up converter 382, a power supply 383 and a test computer 384. The test antenna 54 is disposed adjacent to the second opening 126 of the testing socket 12. As shown in FIG. 20, a portion of the test antenna 54 is disposed in the second opening 126 of the testing socket 12 and in the through hole 501 of the bottom circuit board 50 so that the test antenna 54 is exposed in the transmission space 144. The type of the test antenna 54 may be horn antenna, patch antenna, array antenna, or radiofrequency unit (RU), for example. The power supply 383 and the test computer 384 are electrically connected to the convertor board 36 and the top circuit board 34 to control the DUT 4. The test computer 384 may include a processor, and may execute instructions written on a machine-readable medium that, when executed by the processor, cause the processor to perform processes described herein, such as analysis of an electromagnetic signal.

In the embodiment illustrated in FIG. 20, the testing system 3 can test the emitting function and/or the receiving function of the DUT 4. For example, under a first testing mode, the emitting function of the DUT 4 is tested. The tester 38 controls the DUT 4 to emit high frequency waves (e.g., mmWaves having a wavelength on the order of millimeters). The high frequency wave emitted from the DUT 4 may pass through the first signal transmission portion 211 and/or the second signal transmission portion 212 of the device holder 2, then be reflected by the reflection surfaces 143 of the reflector 14, and then received by the test antenna 54. Then, the signals from the test antenna 54 may be lowered to an intermediate frequency by the down converter 381. Finally, the tester 38 can determine whether a desired emitting function of the DUT 4 is achieved according to an analysis of the signals from the down converter 381. In addition, under a second testing mode, the receiving function of the DUT 4 is tested. The tester 38 processes intermediate frequency signals to high frequency signals by the up converter 382. Then, the tester 38 controls the test antenna 54 to emit high frequency waves (e.g., mmWaves). The high frequency wave emitted from the test antenna 54 may be reflected by the reflection surfaces 143 of the reflector 14, then pass through the first signal transmission portion 211 and/or the second signal transmission portion 212 of the device holder 2, and then be received by the DUT 4. Finally, the tester 38 can determine whether a desired receiving function of the DUT 4 is achieved according to an analysis of the signals from the DUT 4.

Therefore, the wave may be transmitted in the air (e.g. only in the air). Thus, the material of the device holder 2 may not substantially influence the testing result so that the material of the device holder 2 may not be a significant environmental variable of the testing process. In addition, all of the waves transmitted in the transmission space 144 can be received by the test antenna 54 or the DUT 4 due the design of the reflection surfaces 143. Thus, a size of the testing device 1 can be reduced to X*X*X dimensions, where X is, for example, about 30 cm or less, about 10 cm or less, or about 5 cm or less. The dimensions of the testing device 1 need not be equal to each other. In addition, such a testing method may be performed in less time than comparative testing methods. Therefore, such testing device 1 can be used in a production line during mass production. Further, during the testing process, the DUT 4 need not be rotate by 360 degrees, thus, the testing fixture 11 of the testing device 1 may be more readily designed and manufactured.

Figure 21:
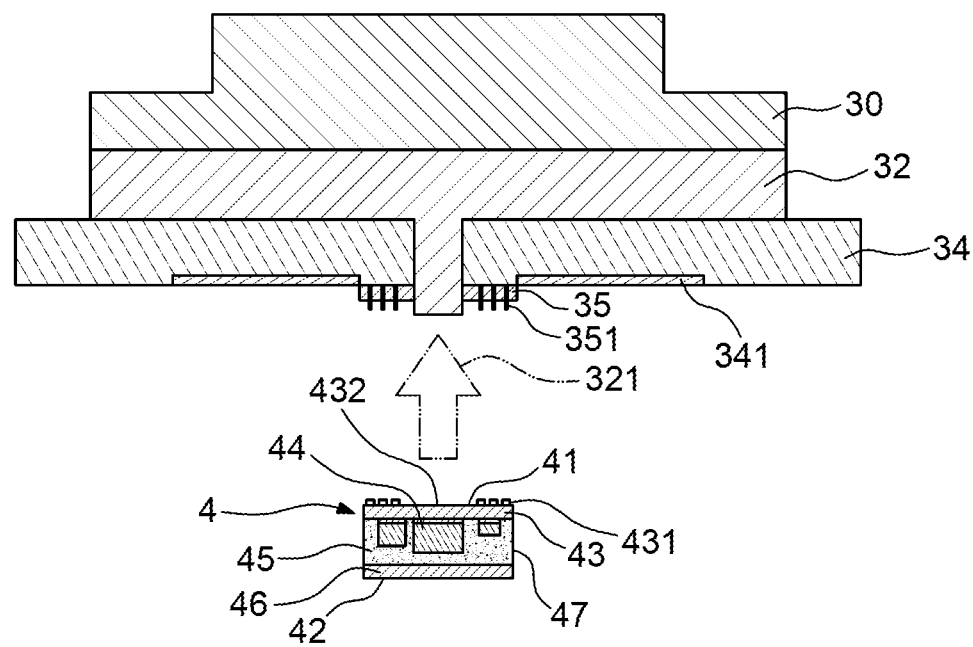
FIG. 21 illustrates one or more stages of an example of a testing method according to some embodiments of the present disclosure.

FIG. 21 through FIG. 24 illustrate a testing method according to some embodiments of the present disclosure. Referring to FIG. 21, the DUT 4, the top circuit board 34 (e.g., a test board), the handler arm 30, the chuck 32 and the connecting socket 35 are provided. In some embodiments, the DUT 4 may be a package structure, and may have a first surface 41, a second surface 42 opposite to the first surface 41, and a plurality of lateral side surface 47. The DUT 4 may include a substrate 43, at least one electrical element 44, an encapsulant 45 and an antenna 46. The substrate 43 is disposed adjacent to the first surface 41, and includes a free area 432 and a plurality of electrical contacts 431 (e.g., solder balls or solder bumps) disposed adjacent to the upper surface of the DUT 4 (e.g., the first surface 41). The free area 432 is disposed on the upper surface of the substrate 43 (e.g., the first surface 41 of the DUT 4), and has no electrical contacts. Thus, the free area 432 is an area for the chuck 32 to contact. The electrical element 44, such as a semiconductor die or a passive element, is electrically connected to the lower surface of the substrate 43. The encapsulant 45, such as a molding compound, covers the lower surface of the substrate 43 and the electrical element 44. The antenna 46 is embedded in or disposed on the encapsulant 45. That is, the antenna 46 is disposed adjacent to the second surface 42 of the DUT 4. The bottom portion of the antenna 46 may be exposed from the second surface 42 of the DUT 4, and a portion of the side portion of the antenna 46 may be exposed from the lateral side surface 47 of the DUT 4. As shown in FIG. 21, the antenna 46 may face downward.

The top circuit board 34 is attached to the handler arm 30 through the chuck 32. The chuck 32 is used for applying suction to the DUT 4. The connecting socket 35 is attached to the lower surface of the top circuit board 34, and includes a plurality of testing probes 351.

Then, the chuck 32 provides a suction force 321 on the free area 432 of the first surface 41 of the DUT 4. Thus, the chuck 32 sucks the first surface 41 of the DUT 4, and the electrical contacts 431 of the DUT 4 can be electrically connected to the top circuit board 34 through the testing probes 351.

Figure 22:
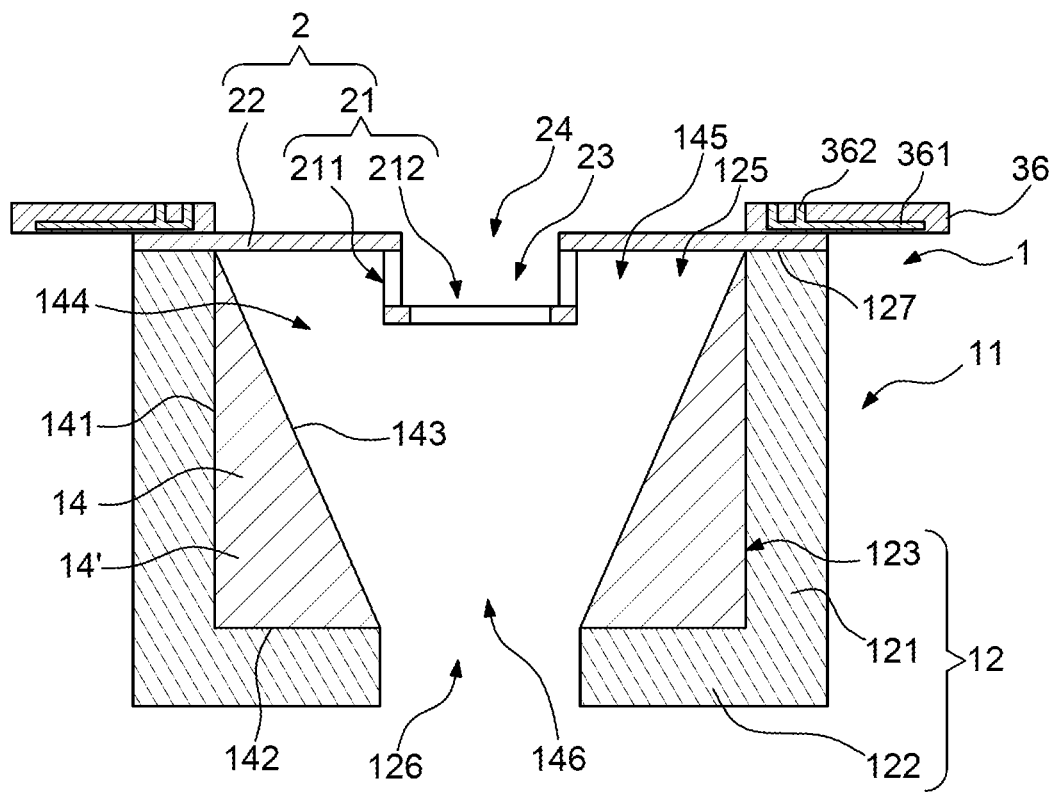
FIG. 22 illustrates one or more stages of an example of a testing method according to some embodiments of the present disclosure.
Figure 23:
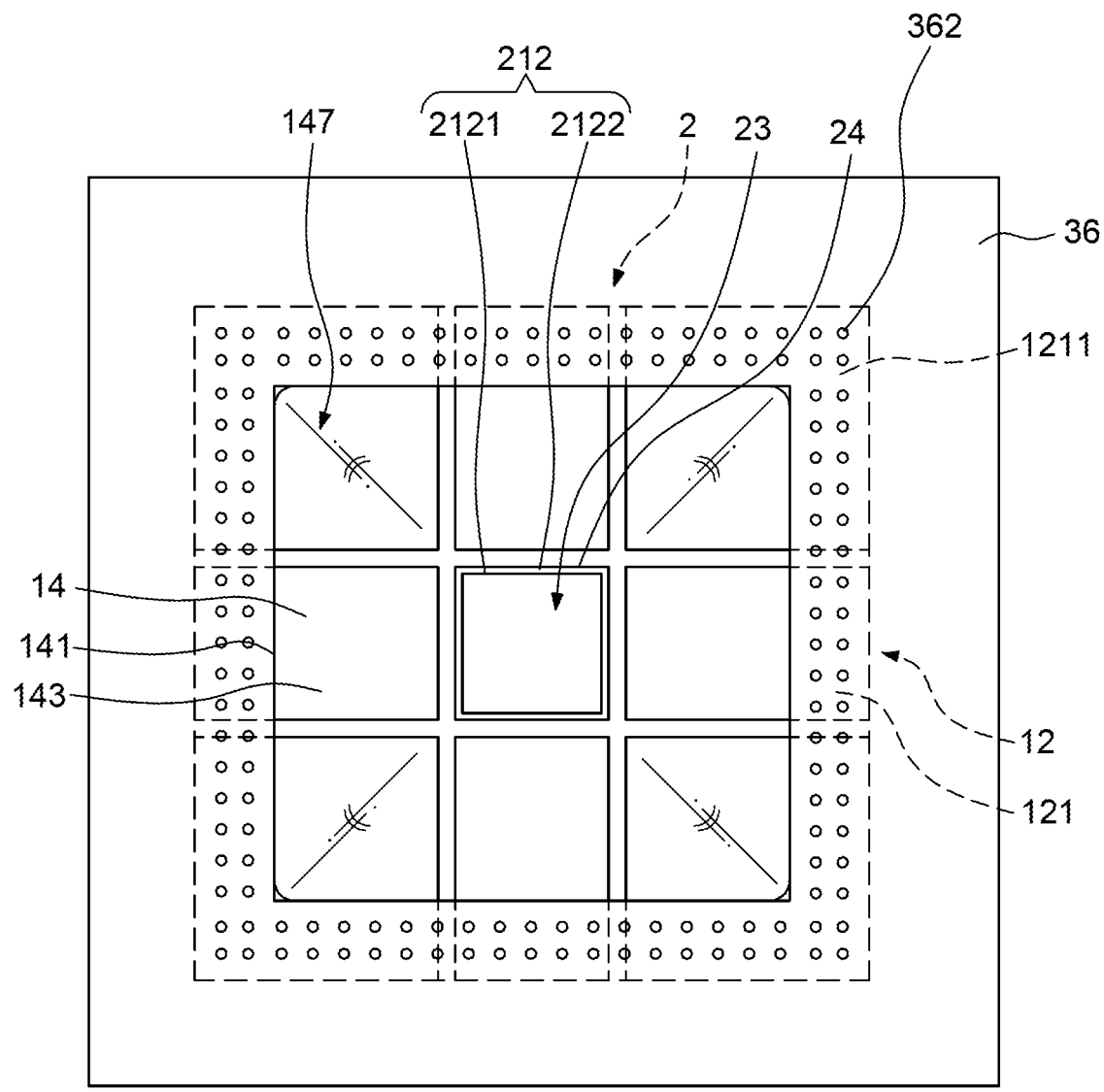
FIG. 23 illustrates a top view of the one or more stages of the testing method shown in FIG. 22.

Referring to FIG. 22 and FIG. 23, FIG. 23 is a top view of the FIG. 22. FIG. 22 and FIG. 23 show the convertor board 36 provided to be disposed on the upper face 1211 of the testing socket 12 of the testing device 1.

Figure 24:
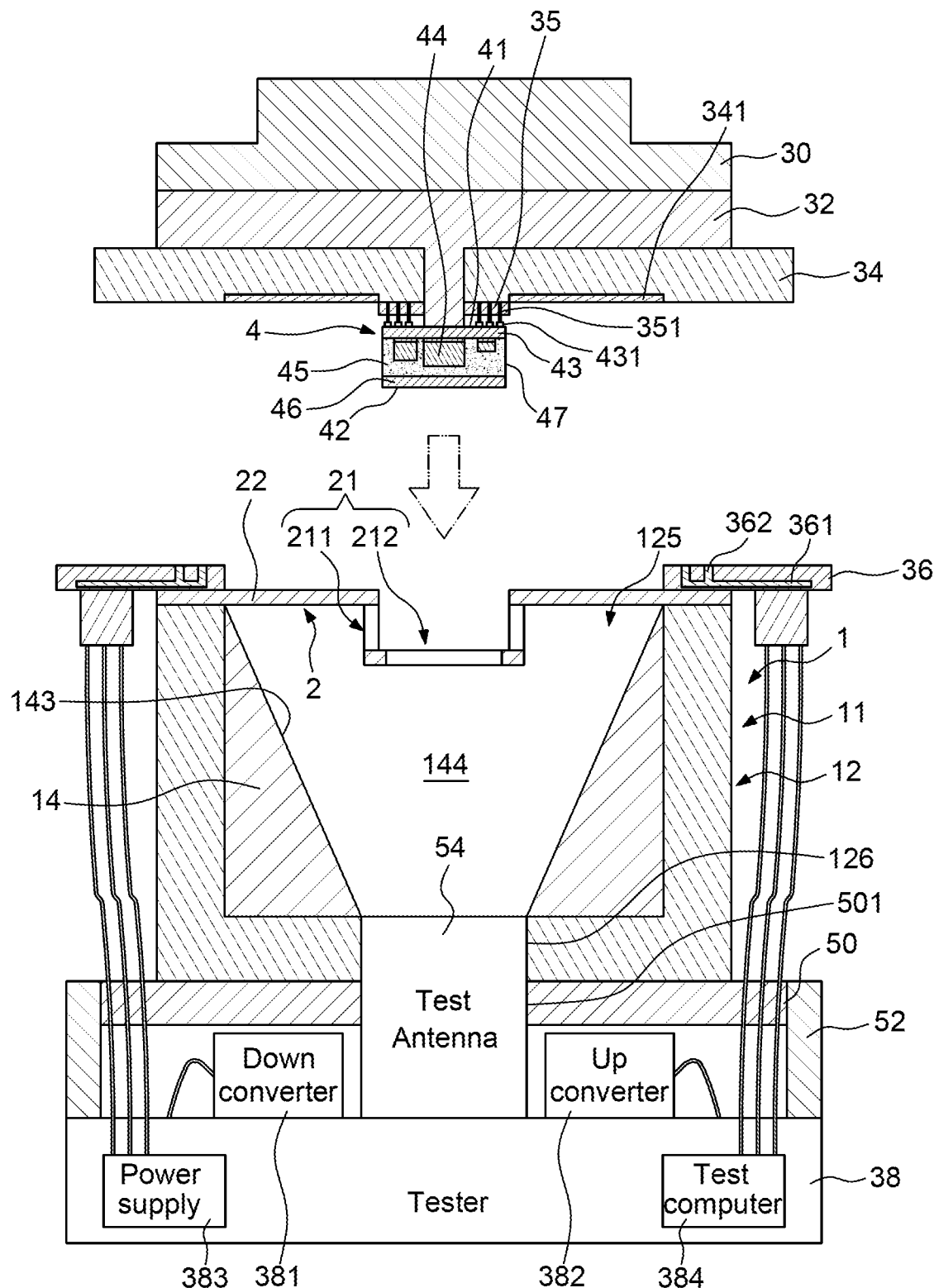
FIG. 24 illustrates one or more stages of an example of a testing method according to some embodiments of the present disclosure.

Referring to FIG. 24, the tester 38, the bottom circuit board 50 and the board stiffener 52 are provided to be disposed below the testing device 1. The board stiffener 52 is disposed on the tester 38 and is used for support the bottom circuit board 50. The testing device 1 is disposed on the bottom circuit board 50. In some embodiments, the bottom circuit board 50 may be electrically connected to the top circuit board 34 through the convertor board 36. In some embodiments, the bottom circuit board 50 may be electrically connected to the tester 38. The tester 38 is electrically connected to the top circuit board 34 through the convertor board 36. The tester 38 includes a test antenna 54, a down converter 381, an up converter 382, a power supply 383 and a test computer 384.

Then, the assembly of the DUT 4, the top circuit board 34, the handler arm 30, the chuck 32 and the connecting socket 35 are moved downward. Thus, as shown in FIG. 20, the DUT 4 can be disposed in the receiving portion 21 of the device holder 2 disposed on the testing socket 12. The device holder 2 accommodates a lower surface (e.g., the second surface 42) of the DUT 4 and the lateral side surface 47 of the DUT 4.

Figure 25:
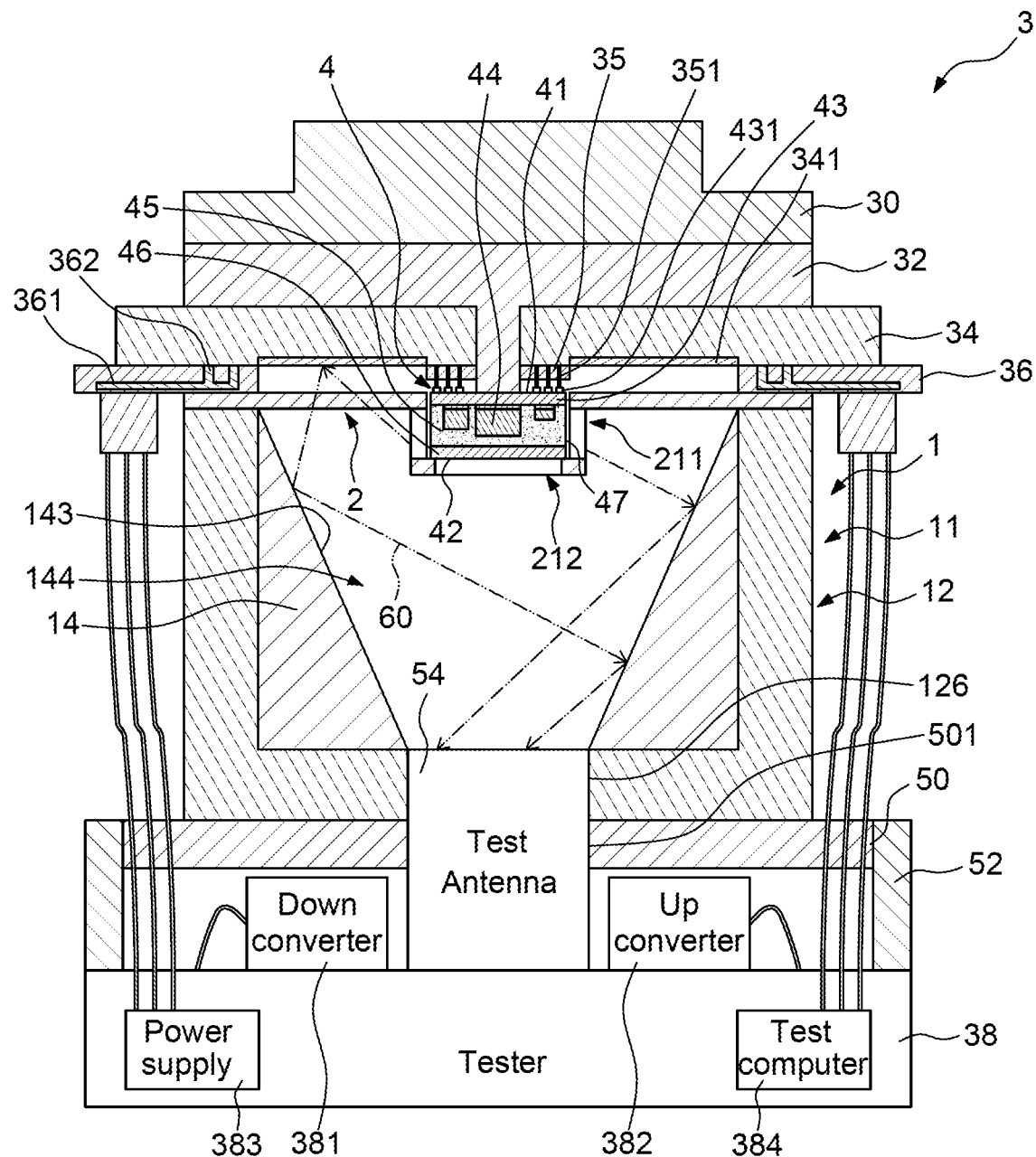
FIG. 25 illustrates a radiation path in a testing system according to some embodiments of the present disclosure.

FIG. 25 illustrates a radiation path in the testing system 3 according to some embodiments of the present disclosure. The antenna 46 of the DUT 4 may be an end fire antenna. The waves 60 emitted by the DUT 4 may be reflected by the reflection surface 143 of the reflector 14 and the reflection portion 341 of the top circuit board 34, and then received by the test antenna 54. In some embodiments, under a testing mode, the frequency waves 60 may be emitted by the test antenna 54, reflected by the reflection surfaces 413 of the reflector 14 and the reflection portion 341 of the top circuit board 34, and then received by the DUT 4.

Figure 26:
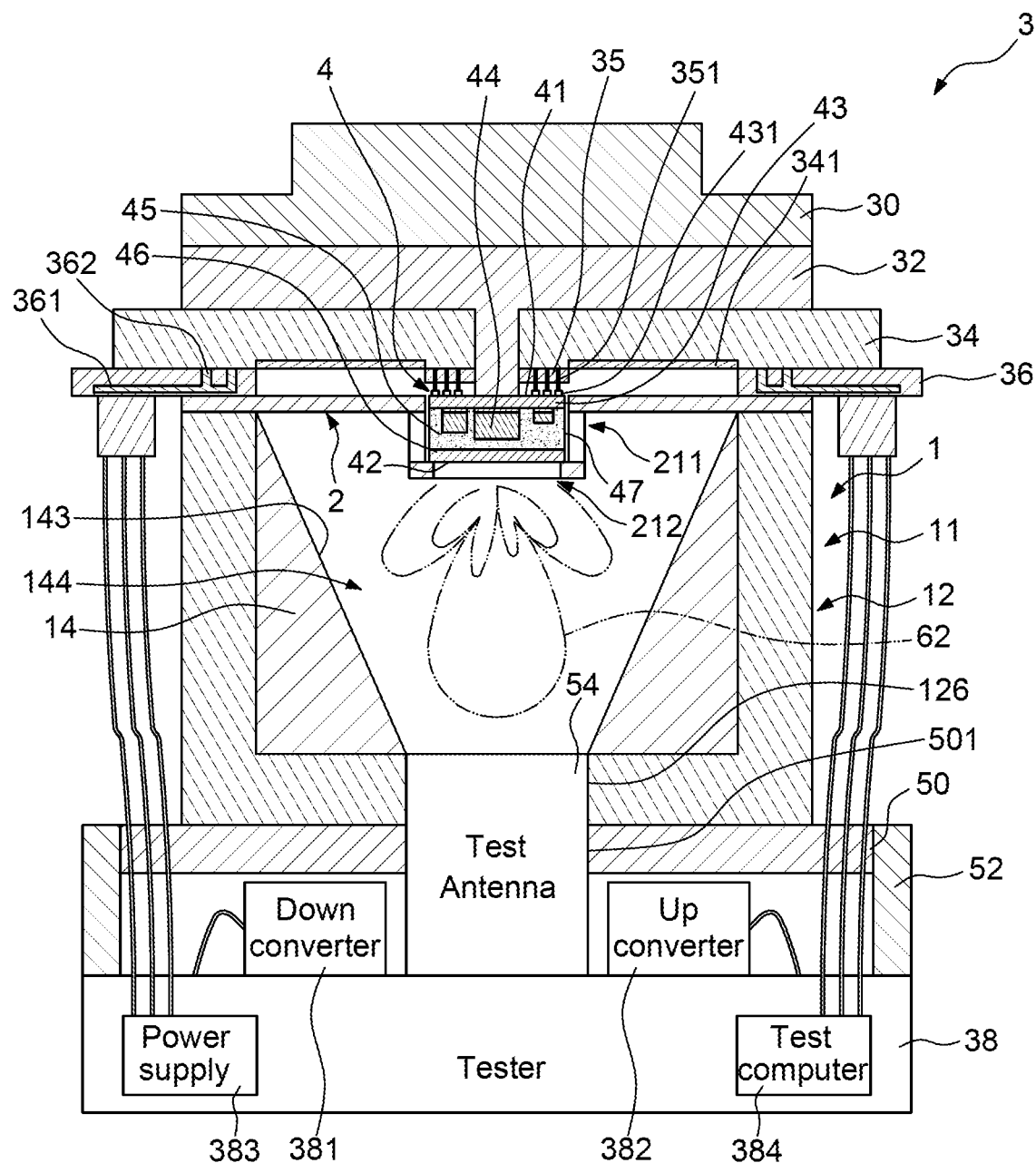
FIG. 26 illustrates a radiation path in a testing system according to some embodiments of the present disclosure.

FIG. 26 illustrates a radiation path in the testing system 3 according to some embodiments of the present disclosure. The antenna 46 of the DUT 4 may be a patch antenna. The frequency waves 62 emitted by the DUT 4 may be reflected by the reflection surface 143 of the reflector 14 and the reflection portion 341 of the top circuit board 34, and then received by the test antenna 54. In some embodiments, under a testing mode, the frequency waves 62 may be emitted by the test antenna 54, reflected by the reflection surfaces 143 of the reflector 14 and the reflection portion 341 of the top circuit board 34, and then received by the DUT 4.

Figure 27:
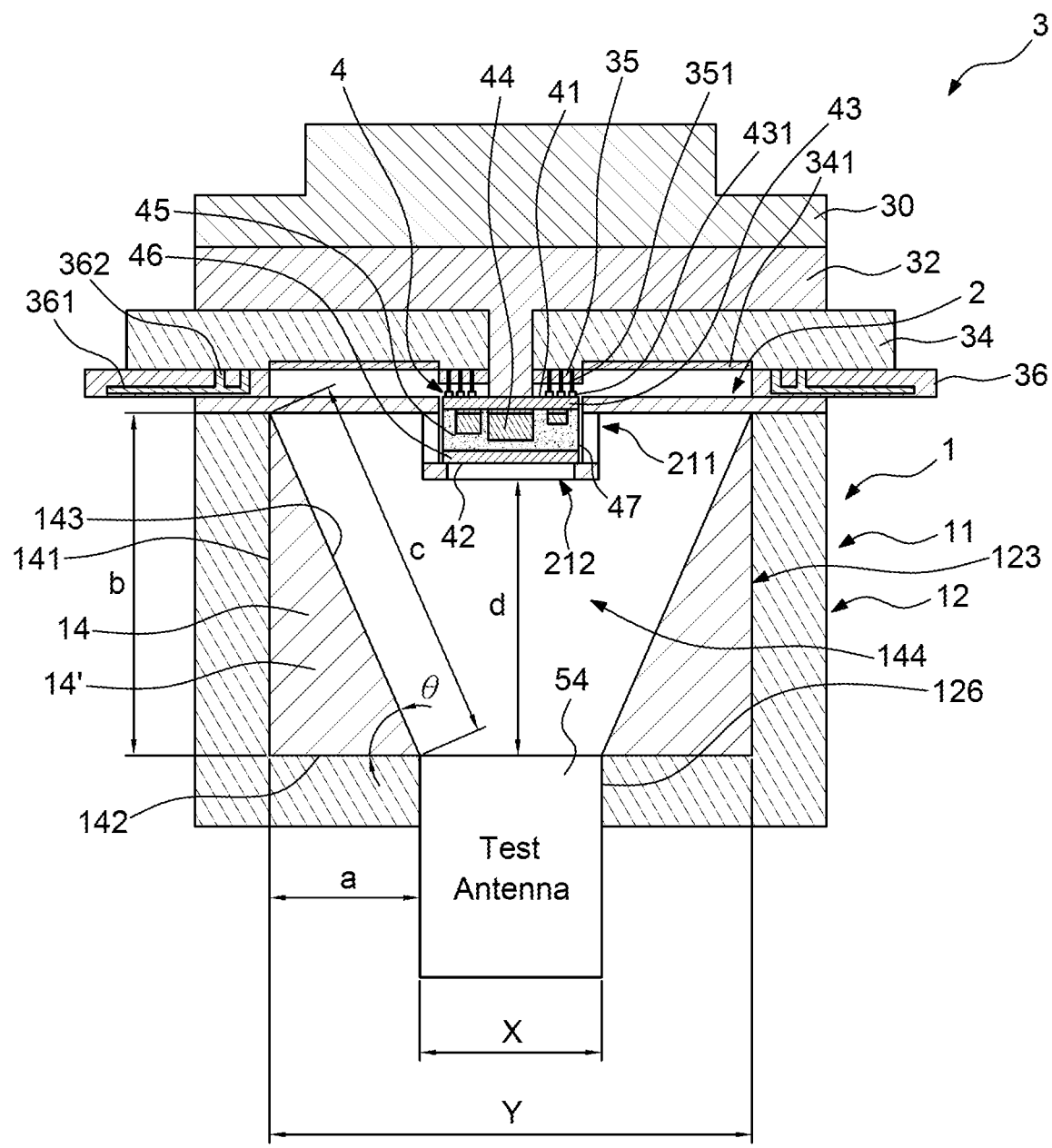
FIG. 27 illustrates various dimensions of a testing system according to some embodiments of the present disclosure.

FIG. 27 illustrates various dimensions in the testing system 3 according to some embodiments of the present disclosure. As shown in FIG. 27, a test distance "d" is defined as a distance between the test antenna 54 and the DUT 4. The operation frequency "F" of the test antenna 54 and the DUT 4 is in a range of about 30 gigahertz (GHz) to about 80 GHz. A near-field measurement is conducted for $\lambda$, to $2\lambda$, wherein $\lambda$ is wavelength. $\lambda=C/F$, wherein "C" is speed of light: $3*10^8$ m/s. Setting "d" to be in a range of "d1" to "d2", $$d1==C/F;$$

$$d2=2\lambda=2*(C/F).$$

For example, the operation frequency "F" is 30 GHz/60 GHz/79 GHz, and the test distance "d" may be respectively as follows:

(a) if F=30 GHz, then, d is in a range of d1 to d2=10 millimeters (mm)~20 mm (b) if F=60 GHz, then, d is in a range of d1 to d2=5 mm~10 mm (c) if F=79 GHz, then, d is in a range of d1 to d2=3.8 mm~7.6 mm In addition, a width of a bottom surface 142 of a reflection portion 14' of the reflector 14 is defined as "a", a height of an outer surface 141 of a reflection portion 14' of the reflector 14 is defined as "b", a length of a reflection surface 143 of a reflection portion 14' of the reflector 14 is defined as "c", a width of the test antenna 54 is defined as "X", a width of the accommodating space 123 of the testing socket 12 is defined as "Y", and an inclination angle between the bottom surface 142 and the reflection surface 143 is defined as "θ".

The relationship a is approximately equal to (Y−X)/2 may hold, in some embodiments.

In one embodiment, if X=20 mm, Y=70 mm, then a=approximately 25 mm. Further, if d=20 mm, b=25 mm, then $c^2=a^2+b^2=1250$, and c is about 35.35 mm. It is noted that θ is about 45 degrees in the presently described example. In some embodiments, θ may be in a range of about 30 degrees to about 45 degrees.

In some embodiments, if X=10 mm, Y=50 mm, then a is approximately equal to 20 mm. Further, if d=45 mm, b=50 mm, then $c^2=a^2+b^2=2900$, and c is about 53.85 mm. It is noted that θ may be greater than 45 degrees. The height b or the inclination angle θ may be predetermined.

Figure 28:
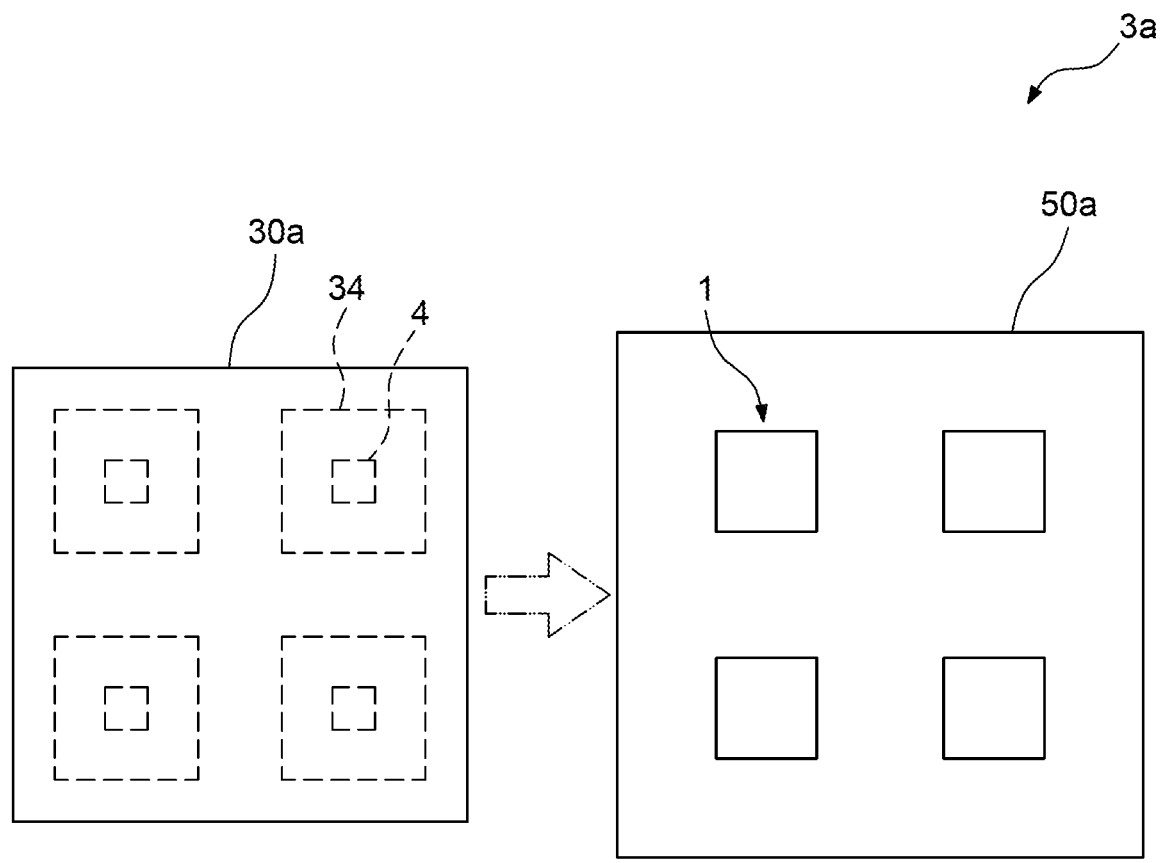
FIG. 28 illustrates a schematic view of a testing system according to some embodiments of the present disclosure.

FIG. 28 illustrates a schematic view of a testing system 3a according to some embodiments of the present disclosure. The testing system 3a may include four DUTs 4, four top circuit boards 34, a handler arm 30a, four testing devices 1 and a bottom circuit board 50a. Each of the DUTs 4 corresponds to a respective one of the top circuit boards 34, and the four DUTs 4 and the four top circuit boards 34 may be handled by one handler arm 30a. The four testing devices 1 may be disposed on one bottom circuit board 50a. The handler arm 30a with the four DUTs 4 and the four top circuit boards 34 may be moved to cover the four testing devices 1, and each of the DUTs 4 is disposed in each of the testing devices 1. Therefore, the testing system 3a can provide for multi-site testing, and the signals in one testing device 1 may not significantly influence an adjacent testing device 1. In some embodiments, more than four DUTs 4, or less than four DUTs 4, can be tested in a multi-site test using a suitable apparatus, Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A testing device, comprising:
    a testing socket having a first upper surface and a second upper surface substantially parallel to the first upper surface; and
    a reflector on the second upper surface and having at least three reflection surfaces extending from the first upper surface till the second upper surface, wherein the at least three reflection surfaces are non-parallel with each other.

2. The testing device of claim 1, wherein the reflector defines a transmission space between the at least three reflection surfaces for accommodating a device under test (DUT).

3. The testing device of claim 1, wherein the testing socket defines an opening, the reflector defines a first opening and a second opening opposite to the first opening, a width of the first opening is greater than a width of the second opening in a cross-sectional view, and the width of the second opening is substantially equal to a width of the opening of the testing socket.

4. The testing device of claim 1, further comprising a device holder surrounded by the at least three reflection surfaces of the reflector, wherein the device holder is configured for receiving a device under test (DUT).

5. The testing device of claim 4, wherein the device holder includes a receiving portion for receiving the DUT, and the receiving portion is disposed between the first upper surface and the second upper surface.

6. The testing device of claim 4, wherein the first upper surface defines a plurality of slots, the device holder has a plurality of extending portions, and a portion of at least one of the extending portions is positioned within at least one of the slots.

7. The testing device of claim 6, wherein the slots are recessed from the plurality of upper surfaces of the testing socket.

8. A testing device, comprising:
    a testing fixture defining a first opening and a second opening opposite to the first opening, and having a plurality of reflection surfaces defining a transmission space between the first opening and the second opening; and
    a device holder disposed in the transmission space, wherein the plurality of reflection surfaces are around the device holder.

9. The testing device of claim 8, wherein the device holder defines an upper opening, a lower opening opposite to the upper opening, and a lateral opening between the upper opening and the lower opening.

10. The testing device of claim 9, wherein the device holder includes a plurality of strips to define the upper opening, the lower opening and the lateral opening.

11. The testing device of claim 9, wherein the testing fixture defines a plurality of slots recessed from a plurality of upper surfaces thereof, the device holder includes an extending portion supported by the testing fixture, and a portion of the extending portion is positioned within the slots.

12. The testing device of claim 11, wherein the testing fixture includes a first side wall and a second side wall opposite to the first side wall, and the slots are recessed from an upper surface of the first side wall and an upper surface of the second side wall.

13. The testing device of claim 8, wherein a plurality of outer surfaces of the device holder are conformal with the plurality of reflection surfaces respectively.

14. The testing device of claim 13, wherein the testing fixture includes:
- a testing socket having a plurality of side walls and a bottom wall; and
- a reflector on the bottom wall and having the plurality of reflection surfaces, wherein the plurality of side walls are around the reflector, wherein a bottom surface of the device holder is substantially aligned with a bottom surface of the reflector.

15. The testing device of claim 13, wherein a top view, the plurality of outer surfaces of the device holder overlap the plurality of reflection surfaces respectively.

16. A testing device, comprising:
- a testing socket configured for accommodating a device under test (DUT) including an antenna, wherein the testing socket defines an opening; and
- a test antenna disposed corresponding to the opening of the testing socket, and configured for receiving an electromagnetic wave directly radiated from the antenna of the DUT and through the opening.

17. The testing device of claim 16, wherein the electromagnetic wave is reflected by a reflector disposed in the testing socket and then received by the test antenna.

18. The testing device of claim 16, further comprising a test board configured to control a DUT to radiate the electromagnetic wave, wherein the DUT is disposed between the test board and the test antenna.

19. The testing device of claim 16, further comprising a device holder configured for receiving a DUT, wherein the electromagnetic wave radiated from the antenna of the DUT at least pass through a bottom portion and a lateral portion of the device holder.

20. The testing device of claim 19, wherein a portion of the device holder is disposed in the testing socket, and between two opposite side walls of the testing socket, wherein the bottom portion of the device holder is disposed between the DUT and the test antenna.

* * * * *